United States Patent
Sugiyama et al.

(10) Patent No.: US 9,906,212 B2
(45) Date of Patent: *Feb. 27, 2018

(54) COMPARATOR CIRCUIT, COMPARATOR CIRCUIT CONTROL METHOD, A/D CONVERSION CIRCUIT, AND DISPLAY APPARATUS

(71) Applicant: Sony Semiconductor Solutions Corporation, Kanagawa (JP)

(72) Inventors: Takaaki Sugiyama, Kanagawa (JP); Ken Kitamura, Kanagawa (JP); Masaki Yoshioka, Kanagawa (JP); Ken Kikuchi, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/439,163

(22) Filed: Feb. 22, 2017

(65) Prior Publication Data
US 2017/0163253 A1 Jun. 8, 2017

Related U.S. Application Data

(63) Continuation of application No. 14/576,824, filed on Dec. 19, 2014, now Pat. No. 9,608,614.

(30) Foreign Application Priority Data

Dec. 27, 2013 (JP) ................. 2013-270704

(51) Int. Cl.
| | |
|---|---|
| *G09G 5/00* | (2006.01) |
| *H03K 5/24* | (2006.01) |
| *G09G 3/32* | (2016.01) |
| *G09G 3/20* | (2006.01) |
| *G09G 3/3233* | (2016.01) |

(Continued)

(52) U.S. Cl.
CPC ......... *H03K 5/2481* (2013.01); *G09G 3/2014* (2013.01); *G09G 3/32* (2013.01); *G09G 3/3233* (2013.01); *H04N 5/378* (2013.01); *H04N 5/3765* (2013.01); *G09G 2310/0297* (2013.01); *G09G 2310/066* (2013.01); *G09G 2370/08* (2013.01)

(58) Field of Classification Search
CPC .................................................. H03K 5/2481
USPC .......................................................... 345/208
See application file for complete search history.

(56) References Cited

U.S. PATENT DOCUMENTS

| | | |
|---|---|---|
| 6,600,483 B1 | 7/2003 | Akita et al. |
| 7,187,355 B2 | 3/2007 | Tam et al. |
| 2005/0134249 A1 | 6/2005 | Doppke et al. |

(Continued)

FOREIGN PATENT DOCUMENTS

JP   11-355387 A   12/1999

OTHER PUBLICATIONS

U.S. Appl. No. 14/576,824, filed Dec. 19, 2014, Sugiyama et al.

*Primary Examiner* — Jason Olson
(74) *Attorney, Agent, or Firm* — Wolf, Greenfield & Sacks, P.C.

(57) ABSTRACT

A comparator circuit includes a differential circuit unit which detects a difference between two input signals, a current supply unit which supplies a current to the differential circuit unit, and a control unit which detects an operation timing of the differential circuit unit and controls the current supplied to the differential circuit unit by the current supply unit according to a detection result thereof.

17 Claims, 22 Drawing Sheets

(51) Int. Cl.
*H04N 5/376* (2011.01)
*H04N 5/378* (2011.01)

(56) References Cited

U.S. PATENT DOCUMENTS

2011/0156772 A1* 6/2011 Lee ..................... H03K 5/1565
                                                    327/155
2015/0187335 A1   7/2015 Sugiyama et al.

* cited by examiner $I_{Drv} = I_{Drv}' + I_{Stby}$

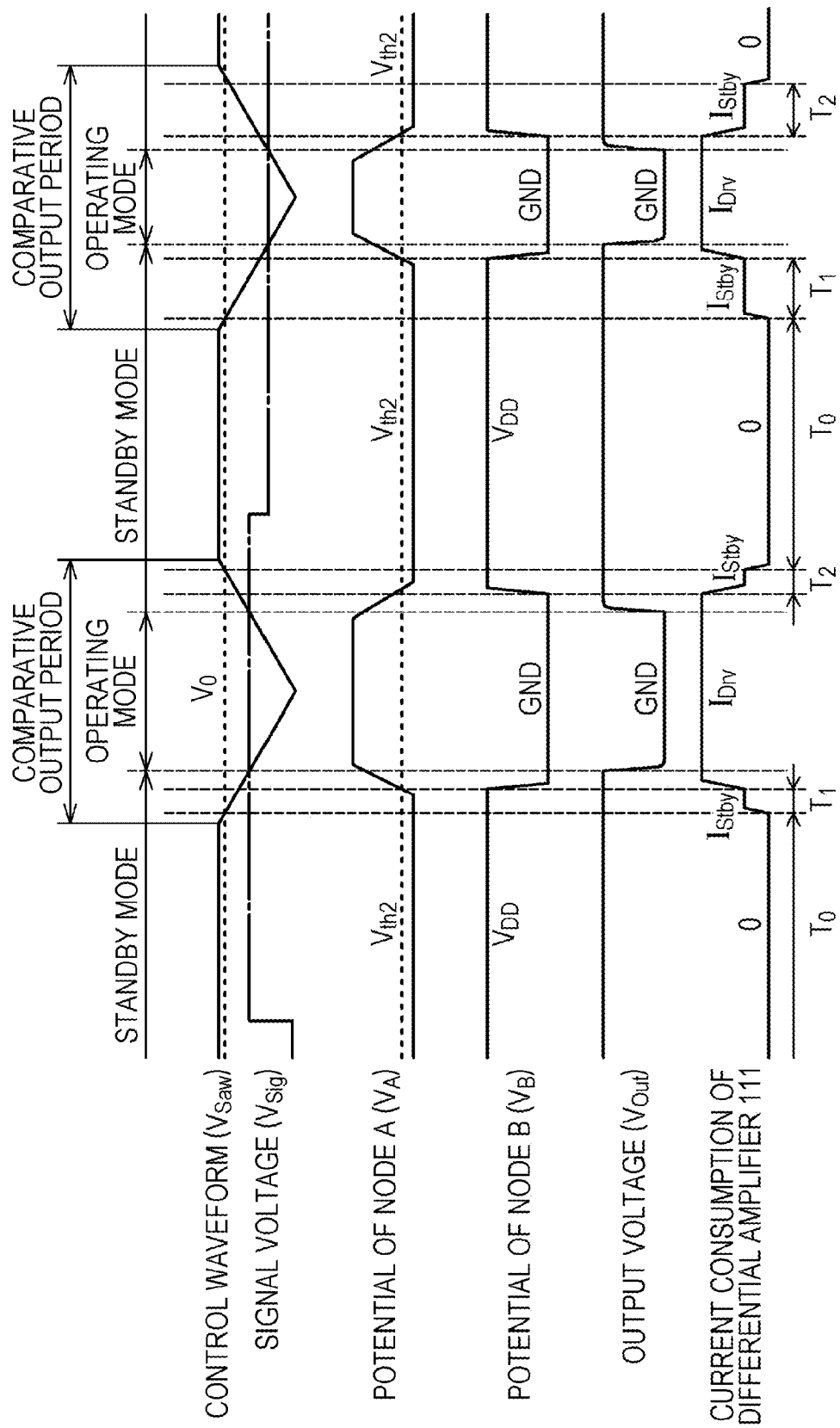

COMPARATOR CIRCUIT, COMPARATOR CIRCUIT CONTROL METHOD, A/D CONVERSION CIRCUIT, AND DISPLAY APPARATUS

CROSS REFERENCE TO RELATED APPLICATIONS

This application is a continuation of and claims the benefit under 35 U.S.C. § 120 of U.S. patent application Ser. No. 14/576,824, titled "COMPARATOR CIRCUIT, COMPARATOR CIRCUIT CONTROL METHOD, A/D CONVERSION CIRCUIT, AND DISPLAY APPARATUS," filed on Dec. 19, 2014, which claims the benefit of Japanese Priority Patent Application JP 2013-270704 filed Dec. 27, 2013; the entire contents of these applications are incorporated herein by reference.

BACKGROUND

The present disclosure relates to a comparator circuit, a comparator circuit control method, an A/D conversion circuit, and a display apparatus.

SUMMARY

As a comparator circuit used in an A/D conversion circuit or the like, a differential type comparator circuit which uses a differential circuit unit for detecting a difference between two input signals is known. In this type of comparator circuit, a current supplied to the differential circuit unit is switched between a standby mode and a usual operating mode in order to reduce power consumption in the standby mode and to reduce an amount of time taken for a shift between the standby mode and the usual operating mode (for example, refer to Japanese Unexamined Patent Application Publication No. 11-355387).

In the comparator circuit according to the related art described above, a configuration in which switching control is performed according to a control signal applied from an external control unit is adopted to switch the current to be supplied to the differential circuit unit between the standby mode and a usual comparative operating mode. However, in the switching control on the basis of a command (the control signal) from outside, it is possible to perform the switching control of the current only according to a sequence which is previously set with respect to the control unit. For this reason, for example, it is difficult to optimize the power consumption according to an operating state of the differential circuit unit.

Therefore, the present disclosure is to provide a comparator circuit, a comparator circuit control method, an A/D conversion circuit, and a display apparatus which are able to further reduce the power consumption by optimizing the power consumption according to the operating state of the differential circuit unit.

According to a first embodiment of the present disclosure, there is provided a comparator circuit including a differential circuit unit which detects a difference between two input signals, a current supply unit which supplies a current to the differential circuit unit, and a control unit which detects an operation timing of the differential circuit unit and controls the current supplied to the differential circuit unit by the current supply unit according to a detection result thereof.

According to a second embodiment of the present disclosure, there is provided a comparator circuit control method, in which in control of a comparator circuit including a differential circuit unit which detects a difference between two input signals, and a current supply unit which supplies a current to the differential circuit unit, an operation timing of the differential circuit unit is detected, and the current supplied to the differential circuit unit by the current supply unit is controlled according to a detection result thereof.

According to a third embodiment of the present disclosure, there is provided an A/D conversion circuit which includes a comparator circuit including a differential circuit unit which detects a difference between two input signals, a current supply unit which supplies a current to the differential circuit unit, and a control unit which detects an operation timing of the differential circuit unit and controls the current supplied to the differential circuit unit by the current supply unit according to a detection result thereof.

According to a fourth embodiment of the present disclosure, there is provided a display apparatus in which a plurality of pixels including a light emitting unit, and a driving circuit for driving the light emitting unit, is arranged in the shape of a two-dimensional matrix, in which the driving circuit includes a comparator circuit which compares a signal voltage and a control waveform, and a driving transistor which drives the light emitting unit according to an output of the comparator circuit, and the comparator circuit includes a differential circuit unit which detects a difference between the signal voltage and the control waveform, a current supply unit which supplies a current to the differential circuit unit, and a control unit which detects an operation timing of the differential circuit unit, and controls the current supplied to the differential circuit unit by the current supply unit according to a detection result thereof.

In the configuration described above, the control unit which detects the operation timing of the differential circuit unit and controls the current supplied to the differential circuit unit by the current supply unit according to the detection result thereof is included (embedded), and thus it is possible to grasp the operating state of the differential circuit unit by the comparator circuit itself and to control the current. That is, the comparator circuit is able to control the current according to the operating state of the differential circuit unit without controlling the current by receiving the control signal from the outside. Accordingly, the power consumption is able to be optimized according to the operating state of the differential circuit unit.

In some embodiments, a comparator circuit comprises a differential circuit configured to detect a difference between two input signals, a current supply configured to supply a current to the differential circuit, and a control unit configured to detect an operation timing of the differential circuit and to control the current supplied to the differential circuit by the current supply according to a detection result thereof.

In some implementations, a method for operating a comparator circuit may comprise detecting, with a differential circuit, a difference between two input signals, and supplying, with a current supply, a current to the differential circuit. The method may further include detecting an operation timing of the differential circuit, and controlling, with a control unit, the current supplied to the differential circuit by the current supply based on the detected operation timing.

According to some embodiments, a display apparatus may comprise a plurality of pixels arranged in a two-dimensional matrix, light emitting units, and driving circuits for driving the light emitting units. The driving circuits may include a comparator circuit configured to compare a signal voltage and a control waveform, and a driving transistor configured to drive a light emitting unit according to an output of the comparator circuit. The comparator circuit may include a differential circuit configured to detect a difference between the signal voltage and the control waveform, a current supply configured to supply a current to the differential circuit, and a control unit configured to detect an operation timing of the differential circuit, and to control the current supplied to the differential circuit by the current supply according to a detection result thereof.

According to the present disclosure, the power consumption is able to be optimized according to the operating state of the differential circuit unit, and thus it is possible to further reduce the power consumption compared to a case where the current is controlled according to a sequence which is previously set.

Furthermore, the effect is not limited to the effect described herein, but may be any effect described in the present disclosure. In addition, the effects disclosed herein are merely exemplifications and are not limited. In addition, additional effects may be obtained.

BRIEF DESCRIPTION OF THE DRAWINGS

FIGS. 5A and 5B are circuit diagrams illustrating a circuit configuration example of a current supply unit in the comparator circuit according to Example 2, in which FIG. 5A illustrates a circuit configuration of a current supply unit according to Circuit Example 1, and FIG. 5B illustrates a circuit configuration of a current supply unit according to Circuit Example 2.

FIG. 10 is a diagram of a timing waveform for describing a circuit operation of the comparator circuit according to Example 4.

FIGS. 11A and 11B are circuit diagrams illustrating a specific circuit configuration of the comparator circuit according to Example 4, in which FIG. 11A illustrates a circuit configuration according to Circuit Example 1, and FIG. 11B illustrates a circuit configuration according to Circuit Example 2.

DETAILED DESCRIPTION OF EMBODIMENTS

Figure 1:
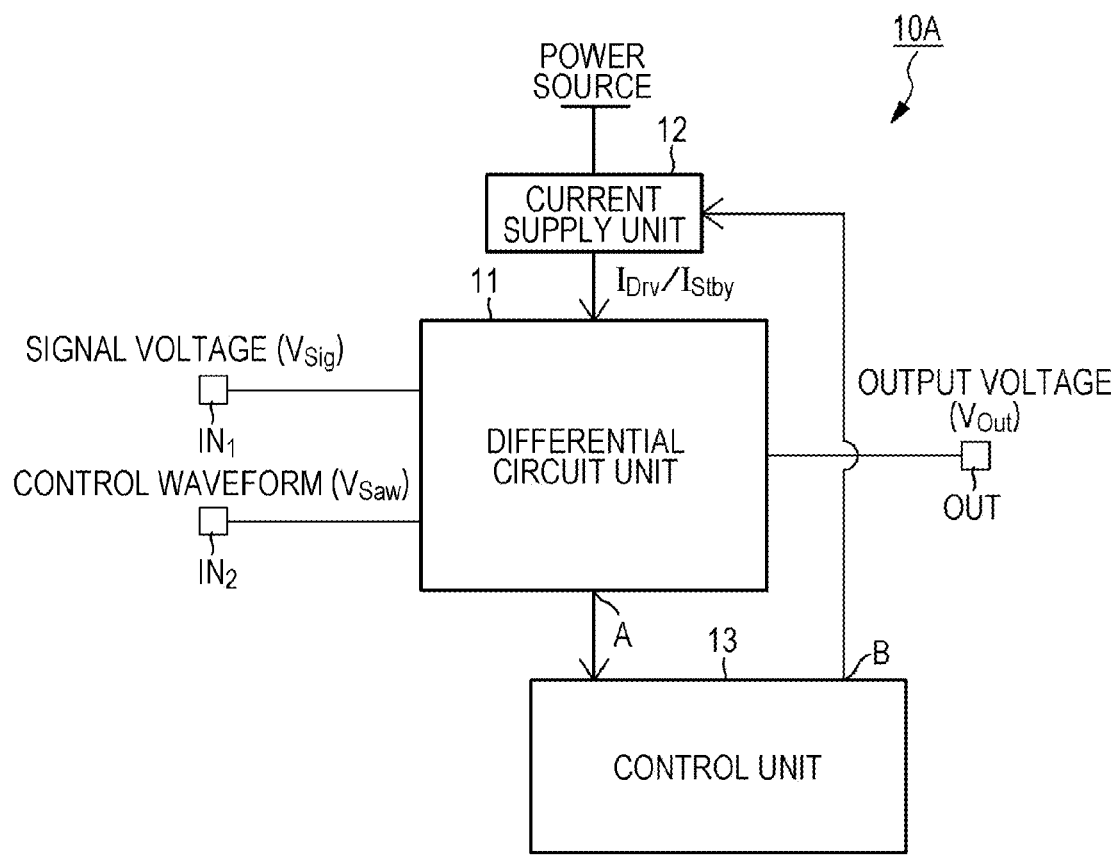
FIG. 1 is a circuit diagram illustrating a configuration of a comparator circuit according to Example 1 of the present disclosure.

Hereinafter, embodiments for implementing the technology of the present disclosure (hereinafter, referred to as "embodiments") will be described in detail with reference to the drawings. The technology of the present disclosure is not limited to the embodiments and various values or the like in the embodiments are illustrative. In the following description, the same reference numeral is used in the same elements or elements having the same function, and the overlapped description will be omitted. Furthermore, the description will be performed according to the following order.

1. Description related to Overall Comparator Circuit, Comparator Circuit Control Method, A/D Conversion Circuit, and Display Apparatus of the present disclosure
2. Example 1 (Comparator Circuit Example 1)
3. Example 2 (Comparator Circuit Example 2)
4. Example 3 (Comparator Circuit Example 3)
5. Example 4 (Comparator Circuit Example 4)
6. Example 5 (Comparator Circuit Example 5)
7. Example 6 (Example of Display Apparatus)
8. Example 7 (Example of Solid State Imaging Apparatus of Serial-Parallel A/D Conversion Method)

Description Related to Overall Comparator Circuit, Comparator Circuit Control Method, A/D Conversion Circuit, and Display Apparatus of the Present Disclosure A comparator circuit to which the technology of the present disclosure is applied may be any type of comparator circuit. As an example, a chopper type comparator circuit or a differential type comparator circuit which includes a differential circuit unit for detecting a difference between two input signals may be illustrated.

The comparator circuit to which the technology of the present disclosure is applied may be configured to be used as a comparator circuit in an A/D conversion circuit in which the comparator circuit is disposed in an input stage. The A/D conversion circuit using the comparator circuit may be used as, for example, an A/D conversion circuit in a solid state imaging apparatus of a serial-parallel A/D conversion method.

In the comparator circuit, the A/D conversion circuit, and the display apparatus of the present disclosure including the preferable configuration described above, the current supply unit may be configured to selectively supply a first current, and a second current which is lower than the first current to the differential circuit unit. In addition, the control unit may control the current supply unit to supply the second current when the differential circuit unit is in a standby state, and to switch a supply of the second current to a supply of the first current right before the differential circuit unit is shifted from the standby state to an operating state.

In addition, in the comparator circuit, the A/D conversion circuit, and the display apparatus of the present disclosure including the preferable configuration described above, the differential circuit unit may include a differential amplifier which outputs a signal according to a difference between two input signals and a first amplifier to which an output signal of the differential amplifier is input. At this time, the control unit may include a second amplifier to which the output signal of the differential amplifier is input, and may control the current supply unit to switch between the first current and the second current according to an output signal of the second amplifier. The second amplifier may include a threshold voltage which is lower than a threshold voltage of the first amplifier.

Alternatively, in the comparator circuit, the A/D conversion circuit, and the display apparatus of the present disclosure including the preferable configuration described above, the current supply unit may include a first current source which supplies the first current, a current constraint unit, and a switch circuit which selectively short-circuits between an input end and an output end of the current constraint unit. The current constraint unit may constrain the first current which is supplied from the first current source to make the second current. At this time, the control unit may control the switch circuit to be in an OFF state when the differential circuit unit is in the standby state, and to be in an ON state right before the differential circuit unit is shifted from the standby state to an operating state.

In addition, in the comparator circuit, the A/D conversion circuit, and the display apparatus of the present disclosure including the preferable configuration described above, the first current source may include a first current source transistor having a channel length corresponding to the first current. At this time, the current constraint unit may include a second current source transistor having a channel length longer than the channel length of the first current source transistor, which is serially connected to the first current source transistor and connected parallel to the switch circuit.

Alternatively, in the comparator circuit, the A/D conversion circuit, and the display apparatus of the present disclosure including the preferable configuration described above, the first current source may include a first current source transistor in which a first bias voltage corresponding to the first current is applied to a gate electrode. At this time, the current constraint unit may include a third current source transistor in which a second bias voltage for narrowing the first current supplied from the first current source transistor to the second current is applied to a gate electrode, and which is serially connected to the first current source transistor, and connected parallel to the switch circuit.

Alternatively, in the comparator circuit, the A/D conversion circuit, and the display apparatus of the present disclosure including the preferable configuration described above, the current supply unit may include a second current source for supplying the second current, and a third current source for supplying a third current which becomes the first current by being added to the second current. At this time, the control unit may control the third current source to be in an inactive state when the differential circuit unit is in the standby state, and to be in an active state right before the differential circuit unit is shifted from the standby state to an operating state.

In addition, in the comparator circuit, the A/D conversion circuit, and the display apparatus of the present disclosure including the preferable configuration described above, the second current source may include a fourth current source transistor in which a third bias voltage corresponding to the second current is applied to a gate electrode. At this time, the third current source may include a fifth current source transistor which is connected parallel to the fourth current source transistor, and outputs the third current at the time of a conductive state.

In addition, in the comparator circuit, the A/D conversion circuit, and the display apparatus of the present disclosure including the preferable configuration described above, the second current source may have a function of selectively blocking the supply of the current with respect to the differential circuit unit in a predetermined period during which the differential circuit unit is in the standby state. In addition, the differential circuit unit may include a differential amplifier which outputs a signal according to the difference between the two input signals, and the second current source may include a first switch circuit which is in an OFF state according to a control waveform and blocks the supply of the current with respect to the differential amplifier in the predetermined period during which the differential circuit unit is in the standby state. In addition, the second current source may include a second switch circuit which stabilizes an output voltage of the differential circuit unit by performing an ON/OFF operation.

Alternatively, in the comparator circuit, the A/D conversion circuit, and the display apparatus of the present disclosure including the preferable configuration described above, the control unit may include a third amplifier, and may control the current supply unit to switch between the first current and the second current according to the output signal of the second amplifier and an output signal of the third amplifier. The third amplifier to which the output signal of the differential amplifier is input may have a threshold voltage higher than the threshold voltage of the first amplifier.

Alternatively, in the comparator circuit, the A/D conversion circuit, and the display apparatus of the present disclosure including the preferable configuration described above, any one of the two input signals may be a signal voltage of a projection signal, and the other one of the two input signals may be a control waveform having a voltage change of a saw tooth waveform.

In the display apparatus of the present disclosure including the preferable configuration described above, the plurality of pixels is arranged in the shape of the two-dimensional matrix in the first direction and the second direction. In the arrangement of the pixel, the pixel group arranged along the first direction may be referred to as a "row direction pixel group", and the pixel group arranged along the second direction may be referred to as a "column direction pixel group". When the first direction is a vertical direction in the display apparatus, and the second direction is a horizontal direction in the display apparatus, the row direction pixel group indicates the pixel group arranged in the vertical direction, and the column direction pixel group indicates the pixel group arranged in the horizontal direction.

In addition, in the display apparatus of the present disclosure including the preferable configuration described above, the plurality of pixels may be arranged in the shape of the two-dimensional matrix in the first direction and the second direction, and the pixel group may be divided into P pixel blocks along the first direction. Then, the light emitting unit configuring the pixel belonging to a first pixel block to the light emitting unit configuring the pixel belonging to a P-th pixel block in each pixel block may sequentially and concurrently emit light, and when the light emitting unit configuring the pixel belonging to a part of the pixel block emits the light, the light emitting unit configuring the pixel belonging to the remaining pixel blocks may not emit the light.

Alternatively, in the display apparatus of the present disclosure including the preferable configuration described above, the light emitting unit may emit the light multiple times on the basis of a plurality of control waveforms. Then, in this case, it is preferable that a time interval of the plurality of control waveforms be constant. In addition, the number of control waveforms supplied to the driving circuit in one display frame may be smaller than the number of control waveforms in the one display frame. Such a conformation is able to be attained by creating a series of a plurality of control waveforms in the one display frame, by masking a part of the series of the plurality of control waveforms at the time that the light emitting unit configuring the pixel belonging to one pixel block does not emit the light, and by not supplying the control waveform to the driving circuit configuring the pixel belonging to the one pixel block.

Further, in the display apparatus of the present disclosure including the various preferable configurations and conformations described above, the light emitting unit may be configured by a light emitting diode (LED). The light emitting diode may have an existing configuration and structure. That is, a light emitting diode which has an optimal configuration and structure and is manufactured of a suitable material may be selected depending on an emission color of the light emitting diode. In the display apparatus including the light emitting diode as the light emitting unit, a light emitting unit including a red light emitting diode functions as a red light emitting sub-pixel (subpixel), a light emitting unit including a green light emitting diode functions as a green light emitting sub-pixel, a light emitting unit including a blue light emitting diode functions as a blue light emitting sub-pixel, and the three types of sub-pixels configure one pixel, and thus a color image may be displayed according to a light emitting state of the three types of sub-pixels.

Furthermore, the "one pixel" in the present disclosure corresponds to the "one sub-pixel" in such a display apparatus, and thus the "one sub-pixel" in such a display apparatus may be construed as the "one pixel". When the three types of sub-pixels configure the one pixel, as the arrangement of the three types of sub-pixels, a delta arrangement, a stripe arrangement, a diagonal arrangement, and a rectangular arrangement may be included. Then, in addition, the light emitting diode may be driven by a constant current on the basis of a PWM driving method, and thus it is possible to prevent a blue shift from being generated in a spectrum wavelength of the light emitting diode. In addition, three panels are prepared, a first panel is configured by the light emitting unit including the red light emitting diode, a second panel is configured by the light emitting unit including the green light emitting diode, and a third panel is configured by the light emitting unit including the blue light emitting diode, and thus light rays from the three panels are able to be collectively applied to a projector, for example, by using a dichroic prism.

Example 1

FIG. 1 is a circuit diagram illustrating a configuration of a comparator circuit according to Example 1 of the present disclosure. As illustrated in FIG. 1, a comparator circuit 10A according to Example 1 includes a differential circuit unit 11, a current supply unit 12, and a control unit 13 in addition to two circuit input terminals $IN_1$ and $IN_2$ and one circuit output terminal OUT.

The differential circuit unit 11 detects a difference between two input signals input to the two circuit input terminals $IN_1$ and $IN_2$. Here, for example, a signal voltage $V_{Sig}$ of a projection signal which is a signal of a comparison target is input to one circuit input terminal $IN_1$. For example, a control waveform $V_{Saw}$ having a voltage change of a saw tooth waveform which is a signal of a comparative criterion is input to the other circuit input terminal $IN_2$. The control waveform $V_{Saw}$ is a saw tooth waveform which is lowered, for example, at a predetermined inclination angle from a maximum level and lifted at the same inclination angle after arriving at a minimum level within a comparative output period of the comparator circuit.

The current supply unit 12 is able to selectively supply a first current, and a second current which is lower than the first current to the differential circuit unit 11. Here, the first current is a driving current (an operating current) $I_{Drv}$ for setting the differential circuit unit 11 to be in an operating state (an acting state). In addition, the second current is a standby current (a stand-by current) $I_{Stby}$ to be supplied to the differential circuit unit 11 at the time of a standby state (a stand-by state). The standby current $I_{Stby}$ is a current of a degree that a settling shortage does not occur when the differential circuit unit 11 is shifted from the standby state (a standby mode) to the operating state (an operating mode), that is, when the differential circuit unit 11 returns from the standby mode.

The control unit 13 detects an operation timing of the differential circuit unit 11. The operation timing of the differential circuit unit 11 described herein is a timing for shifting the differential circuit unit 11 from the standby state (the standby mode) to the operating state (the operating mode) (that is, a timing for entering the operating state), a timing right before the shift of the differential circuit unit 11 from the standby state to the operating state, a timing for shifting the differential circuit unit 11 from the operating state to the standby state, and the like.

The control unit 13 detects the operation timing of the differential circuit unit 11, and controls the current which is supplied to the differential circuit unit 11 by the current supply unit 12 according to a detection result thereof. Specifically, the control unit 13 controls the current supply unit 12 to supply the second current, that is, the standby current $I_{Stby}$ when the differential circuit unit 11 is in the standby state. The control unit 13 further controls the current supply unit 12 to switch a supply of the standby current $I_{Stby}$ to a supply of the first current, that is, a driving current $I_{Drv}$ at the timing right before the shift of the differential circuit unit 11 from the standby state to the operating state.

Figure 2:
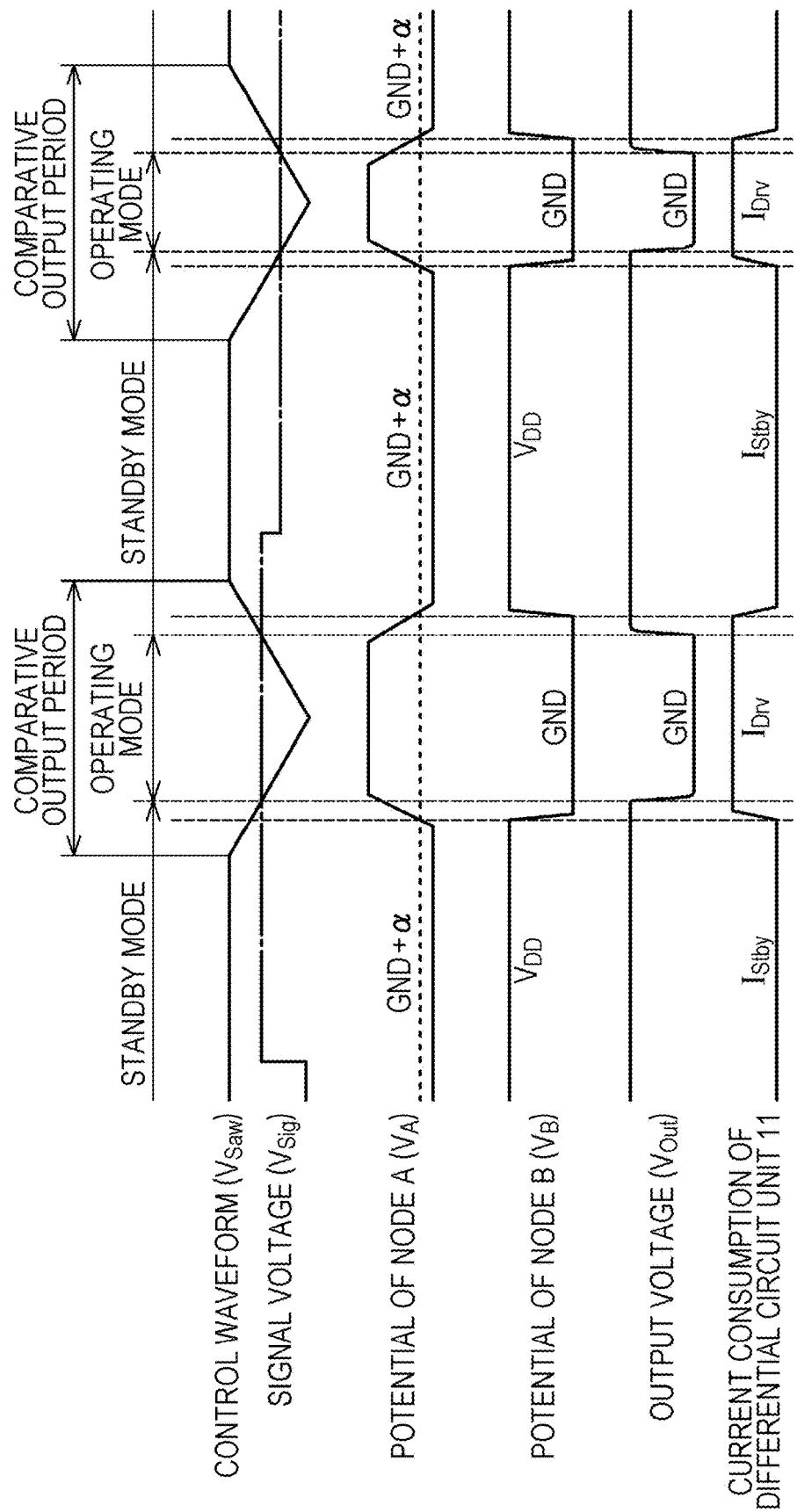
FIG. 2 is a diagram of a timing waveform for describing a circuit operation of the comparator circuit according to Example 1.

FIG. 2 is a diagram of a timing waveform for describing a circuit operation of the comparator circuit 10A according to Example 1. In FIG. 2, each waveform of a control waveform $V_{Saw}$, a signal voltage $V_{Sig}$, a potential of a node A $V_A$, a potential of a node B $V_B$, and an output voltage $V_{Out}$ of the differential circuit unit 11, and a progress of current consumption of the differential circuit unit 11 are illustrated. Here, the node A is an output node of the differential circuit unit 11, and the node B is an output node of the control unit 13. The same is applied to each Example described later.

In the differential circuit unit 11, a period from a timing at which the control waveform $V_{Saw}$ crosses the signal voltage $V_{Sig}$ (in this example, a timing of being below the signal voltage $V_{Sig}$) to a timing at which the control waveform $V_{Saw}$ crosses the signal voltage $V_{Sig}$ again (in this example, a timing of being over the signal voltage $V_{Sig}$) is the operating mode. In the operating mode, a comparative operation is executed, and the output voltage $V_{Out}$ of a low level (for example, a GND level) is output from the circuit output terminal OUT.

On the other hand, in the standby mode of the differential circuit unit 11, the differential circuit unit 11 is in a state where the standby current $I_{Stby}$, that is, the current for preventing the settling shortage at the time of shifting the differential circuit unit 11 from the standby mode to the operating mode is supplied to the differential circuit unit 11 from the current supply unit 12. The standby current $I_{Stby}$ is a current lower than the driving current $I_{Drv}$, more specifically, is a small current of a degree that the settling shortage does not occur. Accordingly, the power consumption in the standby mode of the differential circuit unit 11 is able to be kept lower than the power consumption in the operating mode. In addition, before the differential circuit unit 11 is shifted to the operating mode, the standby current $I_{Stby}$ flows through the differential circuit unit 11, and thus the settling shortage does not occur when the differential circuit unit 11 is shifted to the operating mode.

The potential of the node A $V_A$ which is the output node of the differential circuit unit 11 is changed in response to the voltage change of the saw tooth waveform of the control waveform $V_{Saw}$. The control unit 13 monitors the potential of the node A $V_A$. Then, the control unit 13 detects a timing at which the potential of the node A $V_A$ exceeds a predetermined level. The predetermined level is set to a level for enabling the timing right before the shift of the differential circuit unit 11 from the standby state to the operating state to be detected, in this example, to a level of GND (ground)+α. Here, as in Example 2 described later, when a configuration in which an amplifier (corresponding to a first amplifier 112) is disposed in an output stage of the differential circuit unit 11 is adopted, α is set to a value for satisfying a condition of GND<GND+α<$V_{th1}$ at the time of setting a threshold voltage of the amplifier to $V_{th1}$.

When the potential of the node A $V_A$ exceeds the level of GND+α, the potential of the node B $V_B$ which is the output node of the control unit 13 is shifted from a power source potential $V_{DD}$ to a GND level. The current supply unit 12 receives the shift of the potential of the node B $V_B$, and switches the current which is supplied to the differential circuit unit 11 from the standby current $I_{Stby}$ to the driving current $I_{Drv}$. Accordingly, the differential circuit unit 11 is able to be shifted from the standby mode to the operating mode without causing the settling shortage, and it is possible to reliably perform the comparative operation under the drive according to the driving current $I_{Drv}$ in the operating mode.

As described above, in the comparator circuit 10A according to Example 1, a configuration in which the comparator circuit itself grasps the operating state of the differential circuit unit 11 and controls the current under the control according to the embedded control unit 13 without controlling the current on the basis of a command (a control signal) from outside is adopted. That is, the comparator circuit 10A does not control the current by receiving the control signal from the outside, but controls the current according to the operating state of the differential circuit unit 11.

Accordingly, it is possible to optimize the power consumption according to the operating state of the differential circuit unit 11, and thus even when the current is controlled according to a previously set sequence, the power consumption of the comparator circuit is able to be reduced. In addition, since the control unit 13 which controls the current according to the operating state of the differential circuit unit 11 is embedded, there is an advantage that wiring for transmitting the control signal at the time of controlling the current by receiving the control signal from the outside is not necessary.

The advantage that the wiring is not necessary is particularly effective when a system configuration in which a plurality of comparator circuits is disposed and the plurality of comparator circuits is operated at a different timing is adopted. Specifically, when the current is controlled by receiving the control signal from an external control unit, the wiring for transmitting the control signal from the control unit and the outside to each of the plurality of comparator circuits is necessary, but when the control unit 13 is embedded, the wiring is not necessary, and thus the number of wire lines with respect to a logic circuit or an analog circuit is able to be reduced for the entire system.

Example 2

Figure 3:
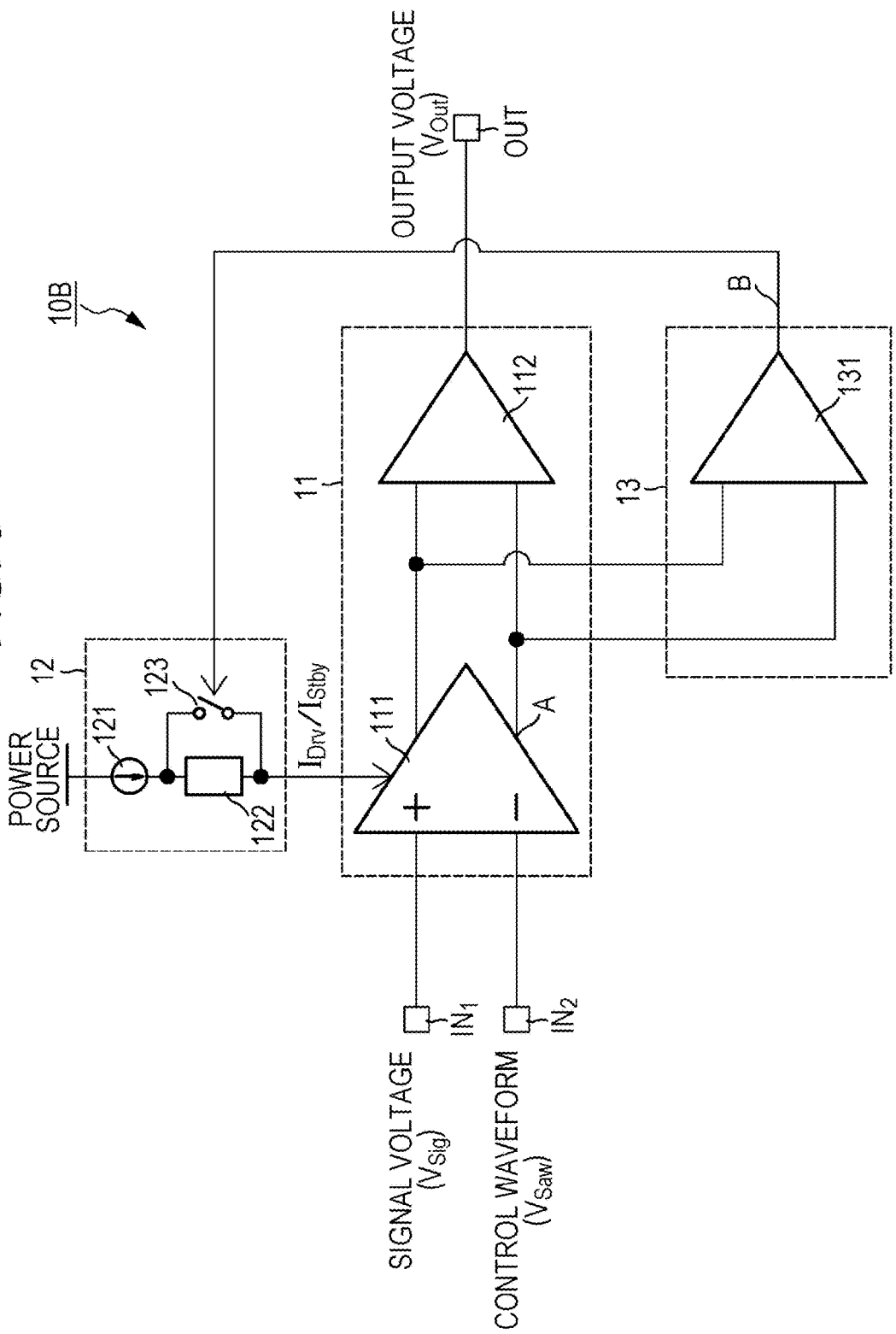
FIG. 3 is a circuit diagram illustrating a configuration of a comparator circuit according to Example 2 of the present disclosure.
Figure 4:
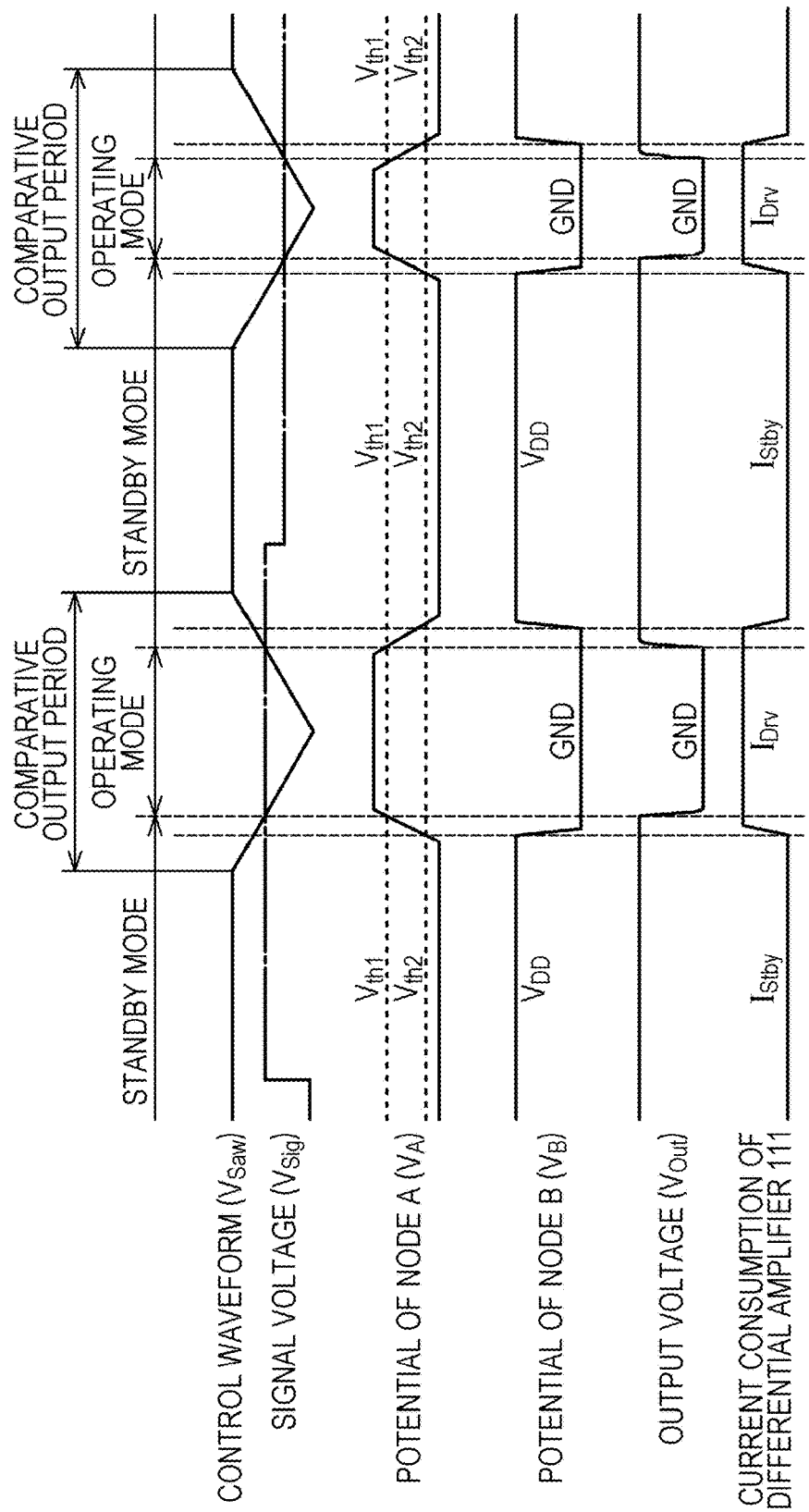
FIG. 4 is a diagram of a timing waveform for describing a circuit operation of the comparator circuit according to Example 2.

FIG. 3 is a circuit diagram illustrating a configuration of a comparator circuit according to Example 2 of the present disclosure. In addition, FIG. 4 is a diagram of a timing waveform for describing a circuit operation of the comparator circuit according to Example 2, and illustrates each waveform of the control waveform $V_{Saw}$, the signal voltage $V_{Sig}$, the potential of the node A $V_A$, the potential of the node B $V_B$, and the output voltage $V_{Out}$, and a progress of current consumption of a differential amplifier 111.

A comparator circuit 10B according to Example 2 is identical to the comparator circuit 10A according to Example 1 in that the comparator circuit 10B includes the differential circuit unit 11, the current supply unit 12, and the control unit 13, the signal voltage $V_{Sig}$ of the projection signal is input to the one circuit input terminal $IN_1$, and the control waveform $V_{Saw}$ is input to the other circuit input terminal $IN_2$.

In the comparator circuit 10B according to Example 2, the differential circuit unit 11 includes a differential amplifier 111 which outputs a signal according to a difference between two input signals, that is, between the signal voltage $V_{Sig}$ and the control waveform $V_{Saw}$, and an amplifier (a first amplifier) 112 to which an output signal of the differential amplifier 111 is input. When the output signal of the differential amplifier 111 exceeds a threshold voltage $V_{th1}$, the amplifier 112 outputs the output voltage $V_{Out}$ of a low level as a comparative result of this comparator circuit 10B.

The current supply unit 12 includes a first current source 121, a current constraint unit 122, and a switch circuit 123. The first current source 121 outputs a driving current $I_{Drv}$ which is a first current. The current constraint unit 122 constrains (narrows) the driving current $I_{Drv}$ supplied from the first current source 121 to a standby current $I_{Stby}$ which is a second current. The switch circuit 123 selectively short-circuits between an input end and an output end of the current constraint unit 122.

In the current supply unit 12, when the switch circuit 123 is in an ON (closed) state, the switch circuit 123 short-circuits between the input end and the output end of the current constraint unit 122, and thus the driving current $I_{Drv}$ output from the first current source 121 is directly supplied to the differential amplifier 111.

In addition, when the switch circuit 123 is in an OFF (open) state, the standby current $I_{Stby}$ obtained by constraining the driving current $I_{Drv}$ (narrowing the current) in the current constraint unit 122 is supplied to the differential amplifier 111.

The control unit 13 includes an amplifier (a second amplifier) 131 to which the output signal of the differential amplifier 111 is input. The amplifier 131 of the control unit 13 includes a threshold voltage $V_{th2}$ which is lower than the threshold voltage $V_{th1}$ of the amplifier 112 of the differential circuit unit 11 ($V_{th1} > V_{th2}$), and outputs a signal of a low level (for example, a GND level) when the output signal of the differential amplifier 111 exceeds the threshold voltage $V_{th2}$. The output signal is supplied as a current switching control signal for controlling the current supply unit 12 to switch between the driving current $I_{Drv}$ and the standby current $I_{Stby}$.

Here, a timing at which the output signal (the potential of the node A $V_A$) of the differential amplifier 111 exceeds the threshold voltage $V_{th2}$ is a timing right before the shift of the differential circuit unit 11, that is, the differential amplifier 111 from the standby state to the operating state. Accordingly, the control unit 13 controls the switch circuit 123 to switch to the OFF state when the differential amplifier 111 is in the standby state, and to switch to the ON state right before the differential amplifier 111 is shifted from the standby state to the operating state under the control according to the current switching control signal.

Figure 5A:
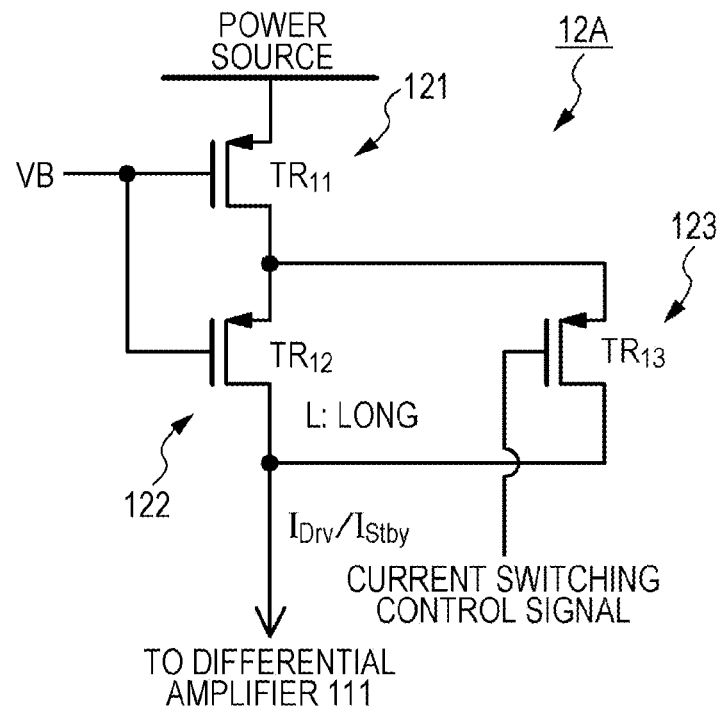
Figure 5B:
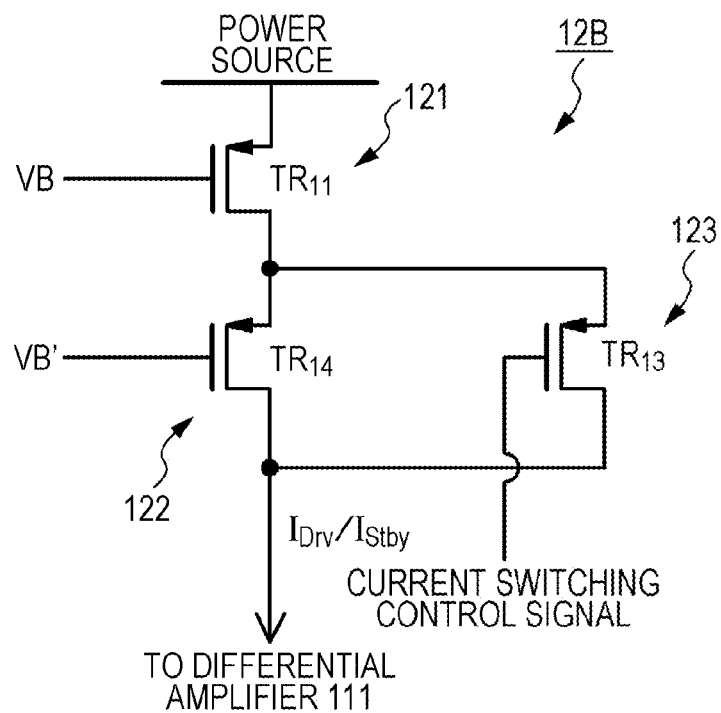

In FIGS. 5A and 5B, a circuit configuration example of a current supply unit 12 in the comparator circuit 10B according to Example 2 is illustrated.

Current Supply Unit According to Circuit Example 1

FIG. 5A is a circuit diagram illustrating a circuit configuration of a current supply unit 12A according to Circuit Example 1. In the current supply unit 12A according to Circuit Example 1, the first current source 121 includes a first current source transistor, for example, a P-channel type electric field effect transistor $TR_{11}$. In the P-channel type electric field effect transistor $TR_{11}$, the driving current $I_{Drv}$ is determined on the basis of a channel length L, a channel width W, a bias voltage VB applied to a gate electrode, and the like.

The current constraint unit 122 includes a second current source transistor, for example, a P-channel type electric field effect transistor $TR_{12}$ serially connected to the electric field effect transistor $TR_{11}$, the channel length L of which is longer than that of the P-channel type electric field effect transistor $TR_{11}$. The same bias voltage VB with the P-channel type electric field effect transistor $TR_{11}$ is applied to a gate electrode of the P-channel type electric field effect transistor $TR_{12}$. Here, in the electric field effect transistor, it is known that a current driving ability increases as a ratio of the channel width to the channel length (W/L) becomes higher.

Accordingly, when the bias voltage VB and the channel width W of the P-channel type electric field effect transistor $TR_{11}$ are identical to that of the P-channel type electric field effect transistor $TR_{12}$, the channel length L of the P-channel type electric field effect transistor $TR_{12}$ is longer than that of the P-channel type electric field effect transistor $TR_{11}$, and thus the current driving ability of the P-channel type electric field effect transistor $TR_{12}$ is lower than that of the P-channel type electric field effect transistor $TR_{11}$. Accordingly, in the current constraint unit 122, the driving current $I_{Drv}$ output from the first current source 121 is able to be constrained (narrowed) to the standby current $I_{Stby}$.

The switch circuit 123 which selectively short-circuits between the input end and the output end of the current constraint unit 122 includes a switching transistor, for example, a P-channel type electric field effect transistor $TR_{13}$ connected parallel to the P-channel type electric field effect transistor $TR_{12}$. When the current switching control signal of a low level is applied to the gate electrode from the control unit 13, the P-channel type electric field effect transistor $TR_{13}$ is in an ON (conductive) state, and short-circuits between a source and a drain of the P-channel type electric field effect transistor $TR_{12}$, and thus supplies the driving current $I_{Drv}$ output from the first current source 121 to the differential amplifier 111.

Current Supply Unit According to Circuit Example 2

FIG. 5B is a circuit diagram illustrating a circuit configuration of a current supply unit 12B according to Circuit Example 2. Similar to the current supply unit 12A according to Circuit Example 1, in the current supply unit 12B according to Circuit Example 2, the first current source 121 includes the first current source transistor, for example, the P-channel type electric field effect transistor $TR_{11}$ in which a first bias voltage VB corresponding to the driving current $I_{Drv}$ is applied to the gate electrode.

The current constraint unit 122 includes a third current source transistor, for example, a P-channel type electric field effect transistor $TR_{14}$ serially connected to the electric field effect transistor $TR_{11}$, in which a second bias voltage VB' for constraining (narrowing) the driving current $I_{Drv}$ supplied from the P-channel type electric field effect transistor $TR_{11}$ to the standby current $I_{Stby}$ is applied to the gate electrode. Similar to the current supply unit 12A according to Circuit Example 1, the switch circuit 123 includes the switching transistor, for example, the P-channel type electric field effect transistor $TR_{13}$ connected parallel to the P-channel type electric field effect transistor $TR_{12}$.

In the comparator circuit 10B according to Example 2 of the configuration described above, the same action and the same effect with the comparator circuit 10A according to Example 1 are able to be obtained. That is, it is possible to control the current according to the operating state of the differential circuit unit 11 without controlling the current by receiving the control signal from the outside, and thus the power consumption is able to be optimized according to the operating state of the differential circuit unit 11. Therefore, it is possible to reduce the power consumption of the comparator circuit. In addition, there is an advantage that wiring for transmitting the control signal at the time of controlling the current by receiving the control signal from the outside is not necessary.

Example 3

Figure 6:
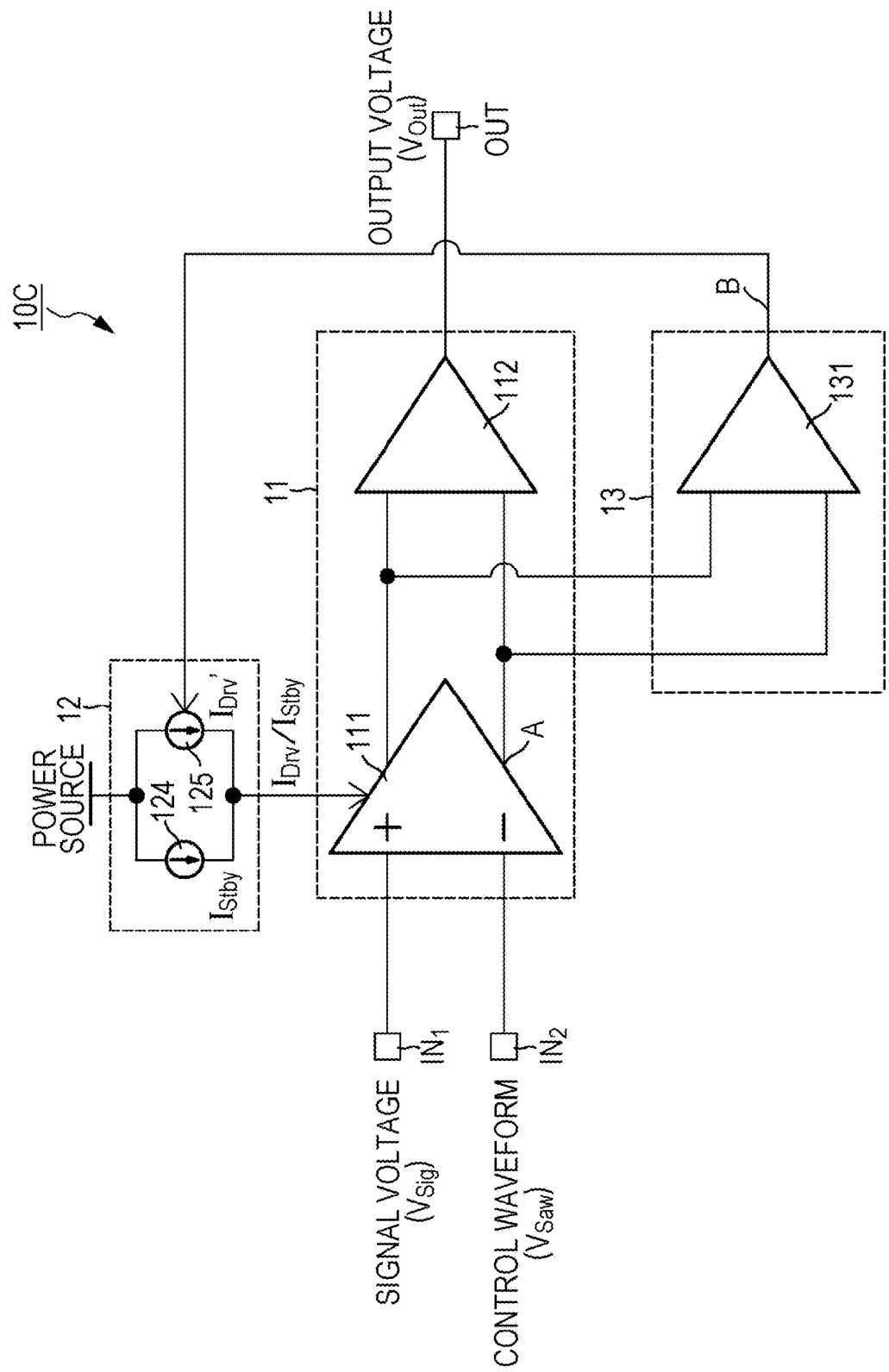
FIG. 6 is a circuit diagram illustrating a configuration of a comparator circuit according to Example 3 of the present disclosure.
Figure 7:
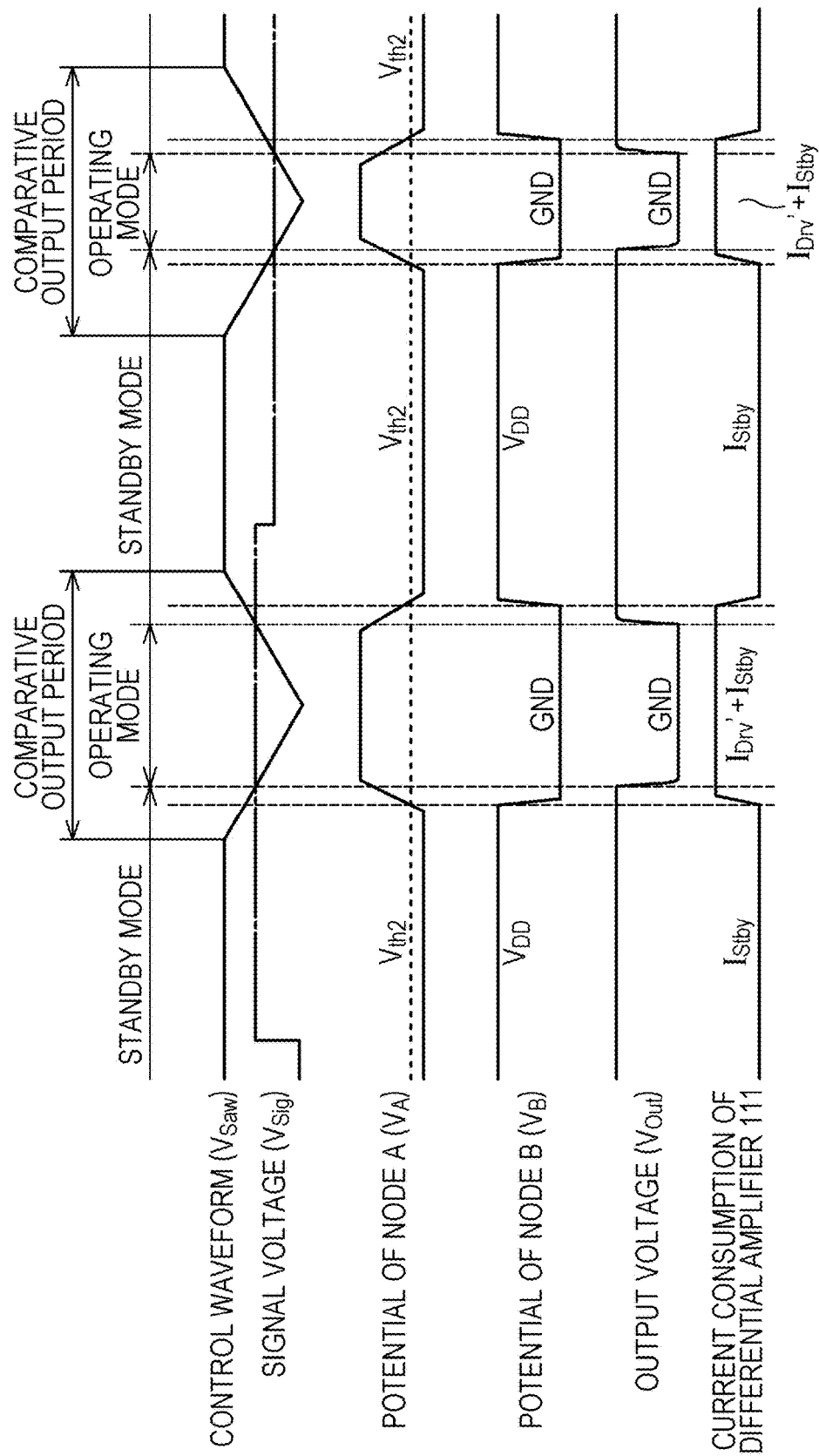
FIG. 7 is a diagram of a timing waveform for describing a circuit operation of the comparator circuit according to Example 3.

FIG. 6 is a circuit diagram illustrating a configuration of a comparator circuit according to Example 3 of the present disclosure. In addition, FIG. 7 is a diagram of a timing waveform for describing a circuit operation of the comparator circuit according to Example 3, and illustrates each waveform of the control waveform $V_{Saw}$, the signal voltage $V_{Sig}$, the potential of the node A $V_A$, the potential of the node B $V_B$, and the output voltage $V_{Out}$, and the progress of the current consumption of the differential amplifier 111.

A comparator circuit 10C according to Example 3 is identical to the comparator circuit 10A according to Example 1 in that the comparator circuit 10C includes the differential circuit unit 11, the current supply unit 12, and the control unit 13, the signal voltage $V_{Sig}$ of the projection signal is input to the one circuit input terminal $IN_1$, and the control waveform $V_{Saw}$ is input to the other circuit input terminal $IN_2$. In addition, a configuration of the differential circuit unit 11 and the control unit 13 is identical to that of the comparator circuit 10B according to Example 2.

The current supply unit 12 includes two current sources of a second current source 124 and a third current source 125, and the current sources 124 and 125 are connected in parallel. The second current source 124 outputs the standby current $I_{Stby}$ which is the second current. The third current source 125 outputs a third current $I_{Drv}'$ which becomes the first current, that is, the driving current $I_{Drv}$ by being added to the standby current $I_{Stby}$ (by addition).

In the comparator circuit 10C according to Example 3, the output signal of the control unit 13 is supplied to the third current source 125 of the current supply unit 12 as an ON/OFF control signal for controlling the current source 125 to switch between an active state (an ON state) and an inactive state (an OFF state). Specifically, the control unit 13 controls the third current source 125 to be in the active state right before the differential amplifier 111 is shifted from the standby state to the operating state, and to be in the inactive state when the differential amplifier 111 is in the standby state according to the ON/OFF control signal supplied to the current supply unit 12.

In the current supply unit 12, when the third current source 125 is in the inactive state, the standby current $I_{Stby}$ output from the second current source 124 is directly supplied to the differential amplifier 111. When the third current source 125 is in the active state, the standby current $I_{Stby}$ output from the second current source 124 and the third current $I_{Drv}'$ output from the third current source 125 are added together, and supplied to the differential amplifier 111 as the driving current $I_{Drv}$.

Current Supply Unit According to Circuit Example 3

Figure 8:
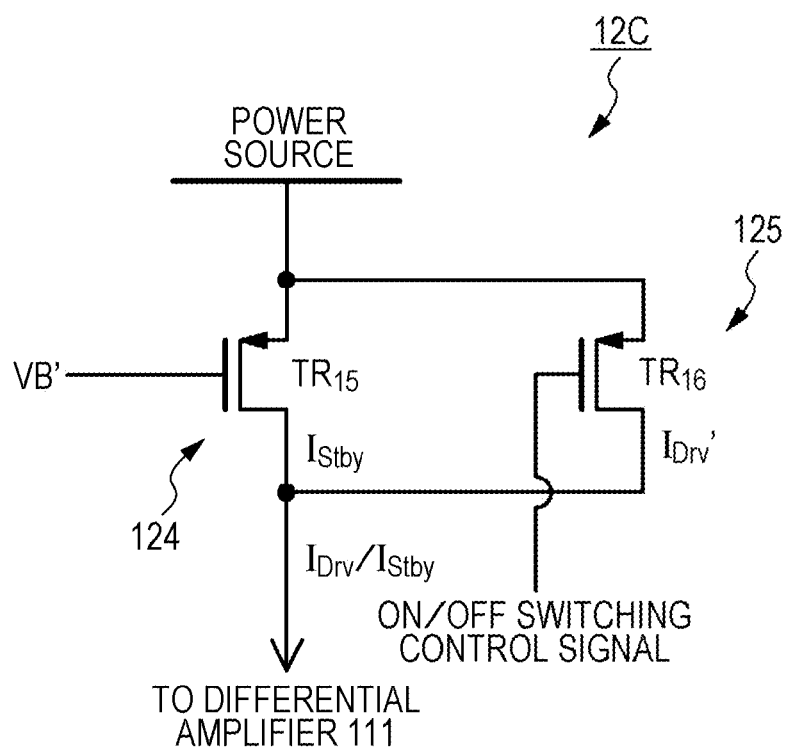
FIG. 8 is a circuit diagram illustrating a circuit configuration example of a current supply unit (a current supply unit according to Circuit Example 3) of the comparator circuit according to Example 3.

FIG. 8 is a circuit diagram illustrating a circuit configuration example of a current supply unit (a current supply unit according to Circuit Example 3) of the comparator circuit according to Example 3. In the current supply unit 12C according to Circuit Example 3, the second current source 124 includes a fourth current source transistor, for example, a P-channel type electric field effect transistor $TR_{15}$ in which a third bias voltage VB' corresponding to the standby current $I_{Stby}$ is applied to the gate electrode. The third current source 125 includes a fifth current source transistor, for example, a P-channel type electric field effect transistor $TR_{16}$ which is connected parallel to the P-channel type electric field effect transistor $TR_{15}$, and outputs a third current $I_{Drv}'$ at the time of a conductive (ON) state. The ON/OFF switching control signal output from the control unit 13 is applied to the gate electrode of the P-channel type electric field effect transistor $TR_{16}$.

In the comparator circuit 10C according to Example 3 of the configuration described above, the same action and the same effect with the comparator circuit 10A according to Example 1 are able to be obtained. That is, it is possible to control the current according to the operating state of the differential circuit unit 11 without controlling the current by receiving the control signal from the outside, and thus the power consumption is able to be optimized according to the operating state of the differential circuit unit 11. Therefore, it is possible to reduce the power consumption of the comparator circuit. In addition, there is an advantage that wiring for transmitting the control signal at the time of controlling the current by receiving the control signal from the outside is not necessary.

Furthermore, In Circuit Example 1 to Circuit Example 3, the first current source 121, the current constraint unit 122, the switch circuit 123, the second current source 124, and the third current source 125 are configured as the P-channel type electric field effect transistor, but the configuration is not limited thereto. That is, the first current source 121, the current constraint unit 122, the switch circuit 123, the second current source 124, and the third current source 125 may be configured as an N-channel type electric field effect transistor, and may be configured as a combination of the P-channel type electric field effect transistor and the N-channel type electric field effect transistor.

Example 4

Figure 9:
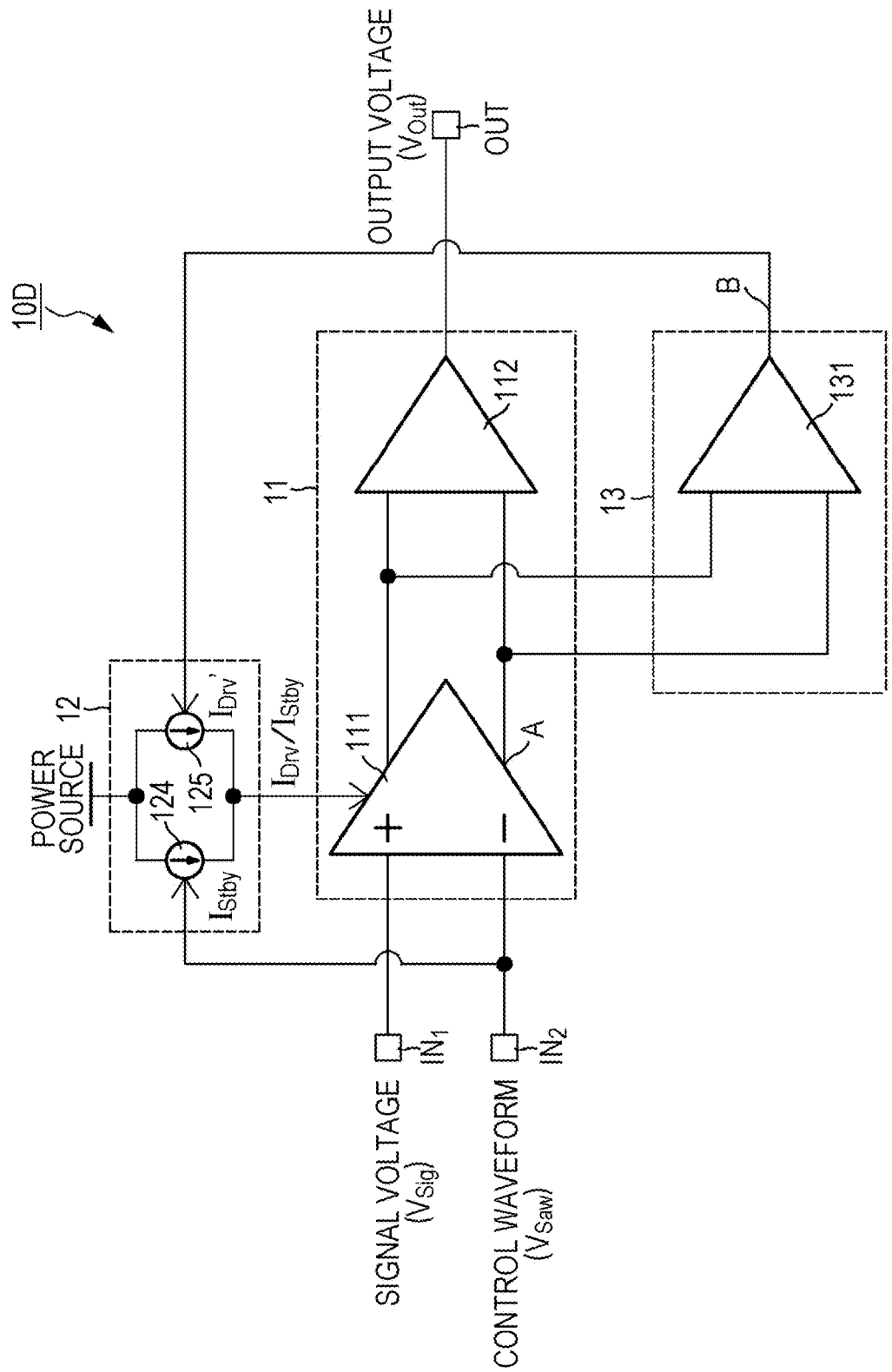
FIG. 9 is a circuit diagram illustrating a configuration of a comparator circuit according to Example 4 of the present disclosure.

FIG. 9 is a circuit diagram illustrating a configuration of a comparator circuit according to Example 4 of the present disclosure. In addition, FIG. 10 is a diagram of a timing waveform for describing a circuit operation of the comparator circuit according to Example 4, and illustrates each waveform of the control waveform $V_{Saw}$, the signal voltage $V_{Sig}$, the potential of the node A $V_A$, the potential of the node B $V_B$, and the output voltage $V_{Out}$, and the progress of the current consumption of the differential amplifier 111.

A comparator circuit 10D according to Example 4 is identical to the comparator circuit 10A according to Example 1 in that the comparator circuit 10D includes the differential circuit unit 11, the current supply unit 12, and the control unit 13, the signal voltage $V_{Sig}$ of the projection signal is input to the one circuit input terminal $IN_1$, and the control waveform $V_{Saw}$ is input to the other circuit input terminal $IN_2$.

In addition, a configuration of the differential circuit unit 11 and the control unit 13 is identical to that of the comparator circuit 10C according to Example 3. The current supply unit 12 includes the two current sources of the second current source 124 which outputs the standby current $I_{Stby}$, and the third current source 125 which outputs the third current $I_{Drv}'$, and the current sources 124 and 125 are connected in parallel. In addition, the control unit 13 controls the third current source 125 to be in the active state right before the differential amplifier 111 is shifted from the standby state to the operating state, and to be in the inactive state when the differential amplifier 111 is in the standby state according to the ON/OFF switching control signal supplied to the current supply unit 12.

Then, in the comparator circuit 10D according to Example 4, the second current source 124 has a function of selectively blocking the supply of the standby current $I_{Stby}$ to the differential amplifier 111 in a predetermined period $T_0$ during which the differential circuit unit 11, more specifically, the differential amplifier 111 is in the standby state (the standby mode). The selective blocking operation of the standby current $I_{Stby}$ in the second current source 124 is executed on the basis of the control waveform $V_{Saw}$ which is lowered and lifted at a predetermined inclination angle between the maximum level and the minimum level within the comparative output period of the comparator circuit. Here, the predetermined period $T_0$ during which the differential amplifier 111 is in the standby state is a period during which the control waveform $V_{Saw}$ is higher than a set level $V_0$ which is lower than the maximum level by a predetermined level on the basis of the set level $V_0$.

In the predetermined period $T_0$ during which the differential amplifier 111 is in the standby state, the supply of the standby current $I_{Stby}$ to the differential amplifier 111 is blocked, and thus the current consumption of the differential amplifier 111 is 0 in the predetermined period $T_0$. Then, a period during which the standby current $I_{Stby}$ is supplied to the differential amplifier 111 is a short period $T_1$ after the end of the predetermined period $T_0$, and a short period $T_2$ before the start of the predetermined period $T_0$. The period $T_1$ is a period from when the predetermined period $T_0$ is ended until when the output signal (the potential of the node A $V_A$) of the differential amplifier 111 exceeds the threshold voltage $V_{th2}$. The period $T_2$ is a period from when the output signal of the differential amplifier 111 is lower than or equal to the threshold voltage $V_{th2}$ until when the predetermined period $T_0$ starts.

Specific Circuit Configuration of Comparator Circuit According to Example 4

Figure 11A:
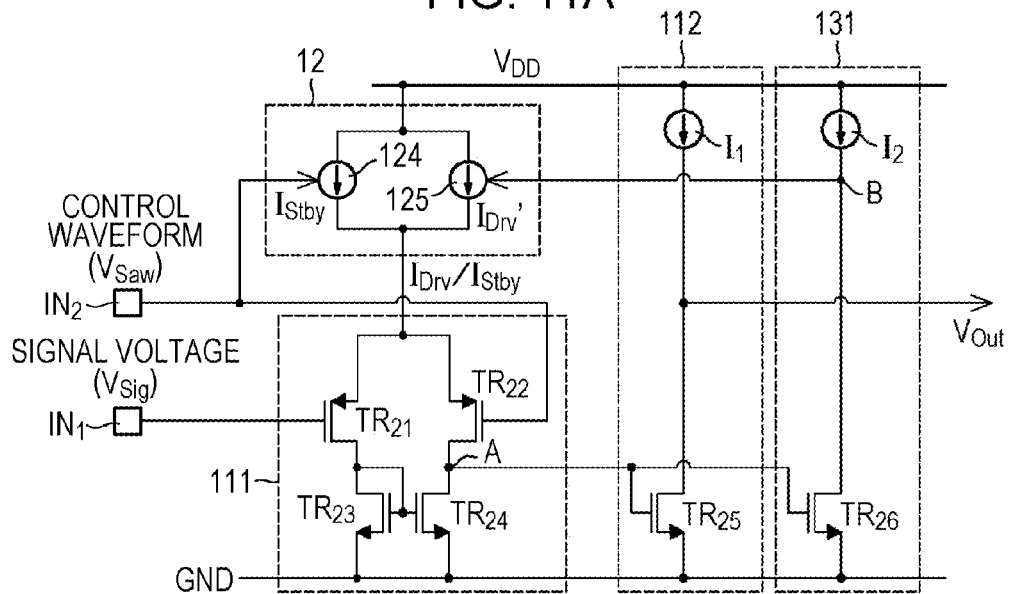
Figure 11B:
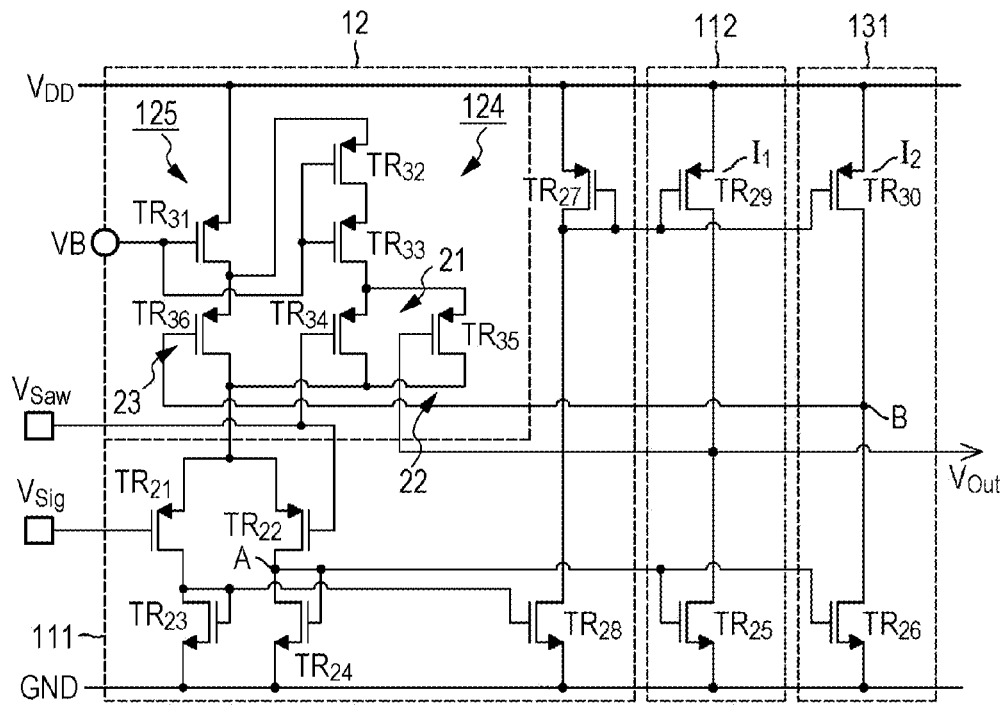

FIGS. 11A and 11B are circuit diagrams illustrating a specific circuit configuration of the comparator circuit 10D according to Example 4, in which FIG. 11A illustrates a circuit configuration according to Circuit Example 1, and FIG. 11B illustrates a circuit configuration according to Circuit Example 2.

Circuit Example 1

As illustrated in FIG. 11A, the differential amplifier 111 has a configuration of an existing differential amplifier including, for example, two P-channel type electric field effect transistors $TR_{21}$ and $TR_{22}$, and two N-channel type electric field effect transistors $TR_{23}$ and $TR_{24}$. The two P-channel type electric field effect transistors $TR_{21}$ and $TR_{22}$ are differential transistor pairs in which a source electrode is commonly connected and a differential operation is performed.

The two N-channel type electric field effect transistors $TR_{23}$ and $TR_{24}$ configure a current mirror circuit which is an active load. Specifically, in the N-channel type electric field effect transistor $TR_{23}$, a drain electrode and a gate electrode are connected to the drain electrode of the P-channel type electric field effect transistor $TR_{21}$, and a source electrode is connected to a power source GND on a low potential side. In the N-channel type electric field effect transistor $TR_{24}$, the gate electrode is connected to the gate electrode of the N-channel type electric field effect transistor $TR_{23}$, the drain electrode is connected to the drain electrode of the P-channel type electric field effect transistor $TR_{22}$, and the source electrode is connected to the power source GND on the low potential side.

In the differential amplifier 111 of the configuration described above, the gate electrode of the P-channel type electric field effect transistor $TR_{21}$ is one input end, and the signal voltage $V_{Sig}$ of the projection signal is input to the gate electrode. In addition, the gate electrode of the P-channel type electric field effect transistor $TR_{22}$ is the other input end, and the control waveform $V_{Saw}$ having the voltage change of the saw tooth waveform is input to the gate electrode. Then, a common connection point (a node) between the drain electrode of the P-channel type electric field effect transistor $TR_{22}$ and the drain electrode of the N-channel type electric field effect transistor $TR_{24}$ is the output end (the node A) of the differential amplifier 111.

The first amplifier 112 includes a current source $I_1$ and an N-channel type electric field effect transistor $TR_{25}$. The current source $I_1$ and the electric field effect transistor $TR_{25}$ are serially connected between a power source $V_{DD}$ of a high potential side and the power source GND of the low potential side. The gate electrode of the electric field effect transistor $TR_{25}$ is connected to the output end of the differential amplifier 111, that is, to the node A. Then, a common connection point between the current source $I_1$ and the electric field effect transistor $TR_{25}$ is the output end of the first amplifier 112, and is connected to the circuit output terminal OUT of this comparator circuit 10D.

A second amplifier 131 for configuring the control unit 13 includes a current source $I_2$ and an N-channel type electric field effect transistor $TR_{26}$. The current source $I_2$ and the electric field effect transistor $TR_{26}$ are serially connected between the power source $V_{DD}$ of the high potential side and the power source GND of the low potential side. The gate electrode of the electric field effect transistor $TR_{26}$ is connected to the output end of the differential amplifier 111, that is, to the node A. Then, a common connection point between the current source $I_2$ and the electric field effect transistor $TR_{26}$ is the output end (the node B) of the second amplifier 131. The signal led to the node B is supplied as the current switching control signal for controlling the current supply unit 12 to switch between the driving current $I_{Drv}$ and the standby current $I_{Stby}$.

Circuit Example 2

In Circuit Example 2, a specific circuit configuration of the current supply unit 12 is mainly described. In this regard, a part of the configuration of the differential amplifier 111, the first amplifier 112, and the second amplifier 131 is slightly different from Circuit Example 1.

The differential amplifier 111 includes a P-channel type electric field effect transistor $TR_{27}$ and an N-channel type electric field effect transistor $TR_{28}$ in addition to the two P-channel type electric field effect transistors $TR_{21}$ and $TR_{22}$, and the two N-channel type electric field effect transistors $TR_{23}$ and $TR_{24}$. The electric field effect transistors $TR_{27}$ and $TR_{28}$ are serially connected between the power source $V_{DD}$ of the high potential side and the power source GND of the low potential side. Then, the electric field effect transistor $TR_{27}$ has a diode connection configuration in which the gate electrode and the drain electrode are commonly connected. In addition, the gate electrode of the electric field effect transistor $TR_{28}$ and the gate electrode of the electric field effect transistor $TR_{23}$ are commonly connected. Furthermore, in the electric field effect transistor $TR_{24}$, the gate electrode and the drain electrode are commonly connected.

The current supply unit 12 includes, for example, three P-channel type electric field effect transistors $TR_{31}$, $TR_{32}$, and $TR_{33}$ which are serially connected to each other, as the current source transistor. The bias voltage VB corresponding to the driving current $I_{Drv}$ is applied to each gate electrode of the electric field effect transistors $TR_{31}$, $TR_{32}$, and $TR_{33}$.

Here, the electric field effect transistor $TR_{31}$ is a current source transistor for creating the driving current $I_{Drv}$, and configures the third current source 125 along with the P-channel type electric field effect transistor $TR_{36}$. Then, the electric field effect transistor $TR_{36}$ has a function identical to the current constraint unit 122 of FIG. 3 in addition to a function as a switch (a second switch circuit) described later, and constrains (narrows) the driving current $I_{Drv}$ to the third current $I_{Drv}'$. The two electric field effect transistors $TR_{32}$ and $TR_{33}$ are current source transistors for creating the standby current $I_{Stby}$ on the basis of the driving current $I_{Drv}$, and configure the second current source 124. That is, the electric field effect transistors $TR_{32}$ and $TR_{33}$ have a function identical to the current constraint unit 122 of FIG. 3, and constrain (narrow) the driving current $I_{Drv}$ to the standby current $I_{Stby}$.

The second current source 124 includes two switch circuits, that is, a first switch circuit 21 and a second switch circuit 22 in addition to the P-channel type electric field effect transistors $TR_{32}$ and $TR_{33}$ which are the current source transistors. The first switch circuit 21 includes a P-channel type electric field effect transistor $TR_{34}$, and performs an ON/OFF operation according to the control waveform $V_{Saw}$. The second switch circuit 22 includes a P-channel type electric field effect transistor $TR_{35}$, and performs the ON/OFF operation according to the output voltage $V_{Out}$ of the differential circuit unit 11, and thus the output voltage $V_{Out}$ is able to be stabilized as described later.

Furthermore, in the circuit example of FIG. 11B, a circuit configuration in which the second switch circuit 22 (the electric field effect transistor $TR_{35}$) is disposed parallel with respect to the first switch circuit 21 (the electric field effect transistor $TR_{34}$) is adopted, but the disposed position is not limited thereto. For example, a circuit configuration in which the second switch circuit 22 is disposed on the source electrode side of the electric field effect transistor $TR_{32}$, or is disposed between the electric field effect transistor $TR_{32}$ and the electric field effect transistor $TR_{33}$ may be adopted. Further, a circuit configuration in which the second switch circuit 22 is connected parallel to the third current source 125 may be adopted.

The third current source 125 includes a switch circuit 23 in addition to the P-channel type electric field effect transistor $TR_{31}$ which is the current source transistor. The switch circuit 23 includes the P-channel type electric field effect transistor $TR_{36}$ described above which has a function of narrowing the driving current $I_{Drv}$ to the third current $I_{Drv}'$. The electric field effect transistor $TR_{36}$ performs the ON/OFF operation according to the output signal (the ON/OFF switching control signal) of the second amplifier 131 for configuring the control unit 13.

In the first amplifier 112, the current source $I_1$ includes a P-channel type electric field effect transistor $TR_{29}$. The electric field effect transistor $TR_{29}$ is serially connected to the electric field effect transistor $TR_{25}$, and the gate electrode thereof is connected to the common connection node between the gate electrode and the drain electrode of the electric field effect transistor $TR_{27}$. In the second amplifier 131, the current source $I_2$ includes a P-channel type electric field effect transistor $TR_{30}$. The electric field effect transistor $TR_{30}$ is serially connected to the electric field effect transistor $TR_{26}$, and the gate electrode thereof is connected to the common connection node between the gate electrode and the drain electrode of the electric field effect transistor $TR_{27}$.

In the current supply unit 12 of the configuration described above, the electric field effect transistor $TR_{34}$ of the second current source 124 is in the OFF state in the predetermined period $T_0$ during which the differential amplifier 111 is in the standby state according to the control waveform $V_{Saw}$ (in a high level zone of the control waveform $V_{Saw}$). Accordingly, the supply of the standby current $I_{Stby}$ to the differential amplifier 111 from the second current source 124 is blocked (stopped). Here, the set level $V_0$ (refer to FIG. 10) described above, which determines the predetermined period $T_0$, corresponds to a threshold voltage of the P-channel type electric field effect transistor $TR_{34}$. Then, in the predetermined period $T_0$ during which the differential amplifier 111 is in the standby state, the supply of the standby current $I_{Stby}$ with respect to the differential amplifier 111 is blocked, and thus the current consumption of the differential amplifier 111 in the predetermined period $T_0$ is 0.

In addition, the electric field effect transistor $TR_{35}$ of the second current source 124 acts as a switch for fixing the output value of the differential amplifier 111, the first amplifier 112, and the second amplifier 131 to the power source potential $V_{DD}$. When the current supplied with respect to the differential amplifier 111 is 0, each potential of the node A and the node B, and the output voltage $V_{Out}$ are likely to be an indefinite value, but this is able to be resolved by an action of the second switch circuit 22 including the electric field effect transistor $TR_{35}$. Specifically, for example, when the output voltage $V_{Out}$ is indefinite, and is below the power source potential $V_{DD}$, the electric field effect transistor $TR_{35}$ is in the ON state. Then, the comparator circuit 10D is in the operating state, and the output voltage $V_{Out}$ becomes the power source potential $V_{DD}$ from $V_{Saw} > V_{Sig}$. Thus, the electric field effect transistor $TR_{35}$ is in a state in which the output voltage $V_{Out}$ is not indefinite. Since the output voltage $V_{Out}$ or the like is not indefinite, it is possible to set the supplying current with respect to the differential amplifier 111 to 0.

In addition, the electric field effect transistor $TR_{36}$ of the third current source 125 switches between the active state and the inactive state of the third current source 125 according to the ON/OFF switching control signal supplied from the second amplifier 131. Specifically, the electric field effect transistor $TR_{36}$ is in the ON state, and thus starts the supply of the third current $I_{Drv}'$ with respect to the differential amplifier 111 (that is, the third current source 125 is in the active state). In addition, the electric field effect transistor $TR_{36}$ is in the OFF state, and thus stops the supply of the third current $I_{Drv}'$ with respect to the differential amplifier 111 (that is, the third current source 125 is in the inactive state).

In the comparator circuit 10D according to Example 4 of the configuration described above, the same action and the same effect with the comparator circuit 10A according to Example 1 are able to be obtained. That is, it is possible to control the current according to the operating state of the differential circuit unit 11 without controlling the current by receiving the control signal from the outside, and thus the power consumption is able to be optimized according to the operating state of the differential circuit unit 11. Therefore, it is possible to reduce the power consumption of the comparator circuit. In addition, there is an advantage that wiring for transmitting the control signal at the time of controlling the current by receiving the control signal from the outside is not necessary.

In addition, in the comparator circuit 10D according to Example 4, in the predetermined period $T_0$ during which the differential amplifier 111 is in the standby state, the supply of the standby current $I_{Stby}$ with respect to the differential amplifier 111 is blocked, and the current consumption is able to be 0, and thus the power consumption of the differential circuit unit 11, and the power consumption of the comparator circuit are able to be further reduced than each Example described above.

Example 5

Figure 12:
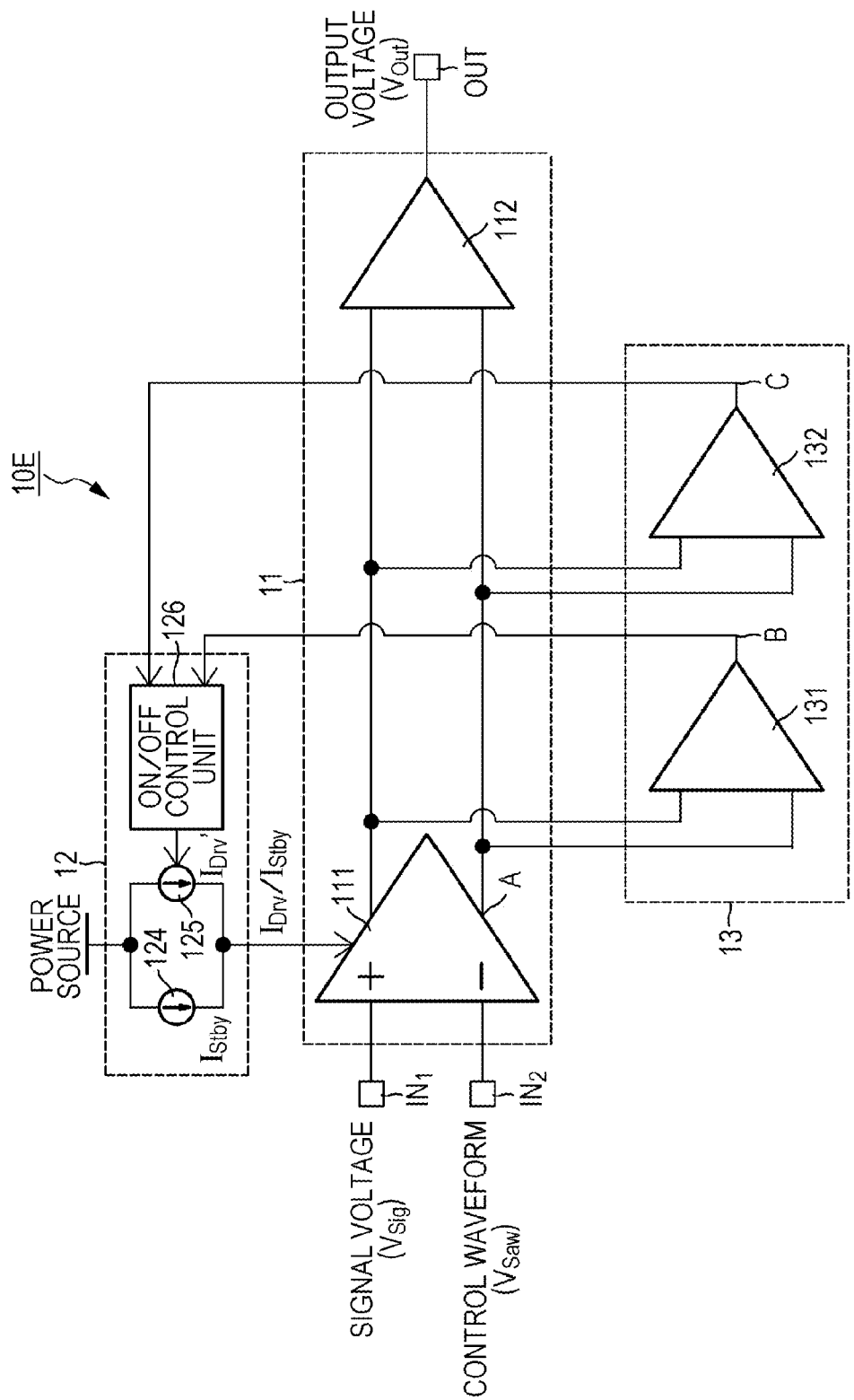
FIG. 12 is a circuit diagram illustrating a configuration of a comparator circuit according to Example 5 of the present disclosure.
Figure 13:
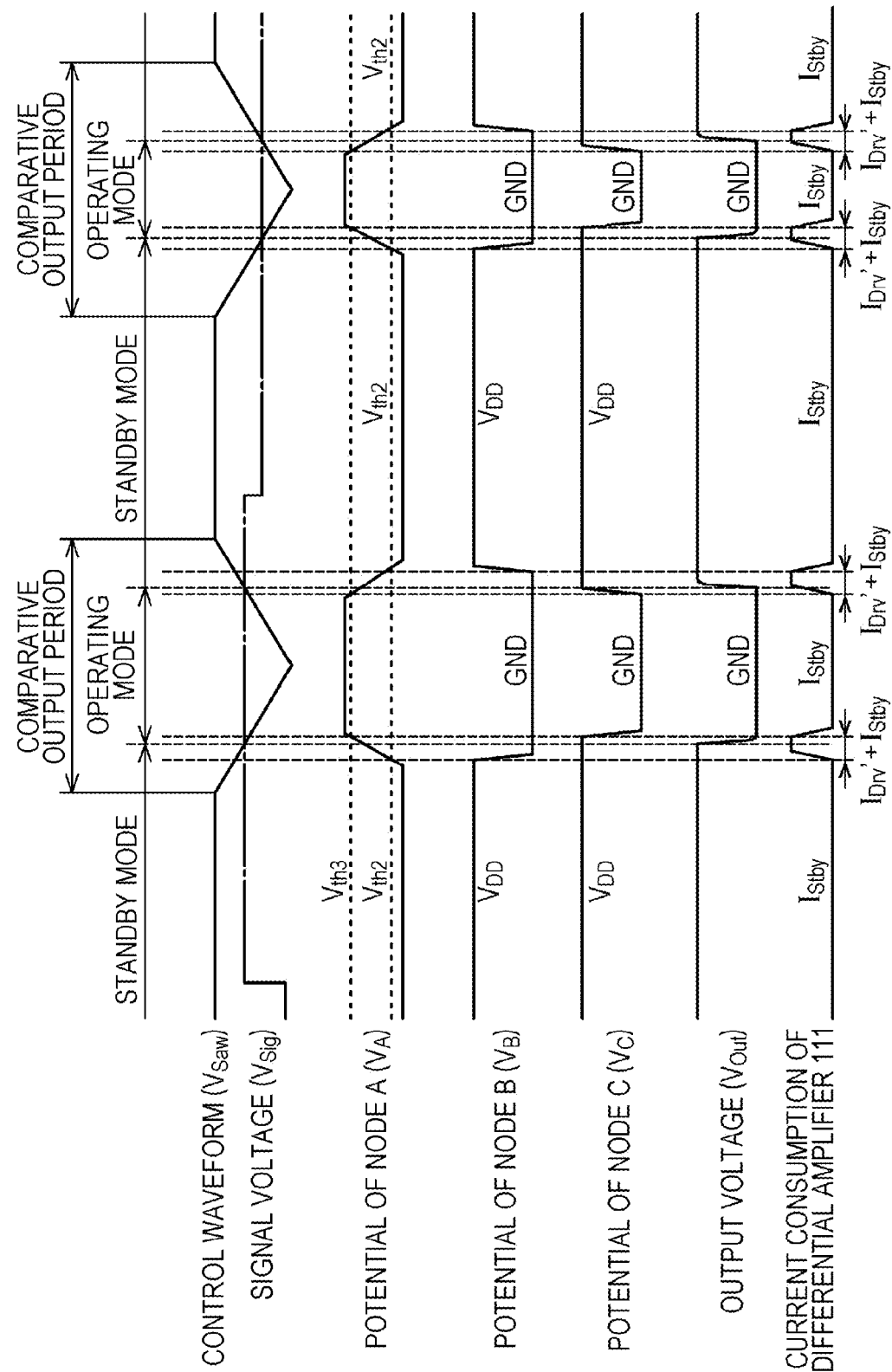
FIG. 13 is a diagram of a timing waveform for describing a circuit operation of the comparator circuit according to Example 5.

FIG. 12 is a circuit diagram illustrating a configuration of a comparator circuit according to Example 5 of the present disclosure. In addition, FIG. 13 is a diagram of a timing waveform for describing a circuit operation of the comparator circuit according to Example 5, and illustrates each waveform of the control waveform $V_{Saw}$, the signal voltage $V_{Sig}$, the potential of the node A $V_A$, the potential of the node B $V_B$, a potential of a node C $V_C$, and the output voltage $V_{Out}$, and the progress of the current consumption of the differential amplifier 111.

A comparator circuit 10E according to Example 5 is identical to the comparator circuit 10A according to Example 1 in that the comparator circuit 10E includes the differential circuit unit 11, the current supply unit 12, and the control unit 13, the signal voltage $V_{Sig}$ of the projection signal is input to the one circuit input terminal $IN_1$, and the control waveform $V_{Saw}$ is input to the other circuit input terminal $IN_2$. In addition, a configuration of the differential circuit unit 11 is identical to that of the comparator circuit 10B according to Example 2.

The current supply unit 12 includes an ON/OFF control unit 126 for performing the ON/OFF control with respect to the third current source 125 in addition to the second current source 124 for outputting the standby current $I_{Stby}$ which is the second current, and the third current source 125 for outputting the third current $I_{Drv}'$. The ON/OFF control unit 126 performs the ON (active) control and the OFF (inactive) control with respect to the third current source 125 on the basis of the control signal applied from the control unit 13.

The control unit 13 includes two amplifiers (the second amplifier and a third amplifier) 131 and 132 to which the output signal of the differential amplifier 111 is input. The amplifier 131 has the threshold voltage $V_{th2}$ which is lower than the threshold voltage $V_{th1}$ of the amplifier (the first amplifier) 112 of the differential circuit unit 11 ($V_{th1} > V_{th2}$), whereas the amplifier 132 has a threshold voltage $V_{th3}$ which is higher than the threshold voltage $V_{th1}$ ($V_{th1} < V_{th3}$).

The second amplifier 131 outputs the control signal of a low level (for example, the GND level) when the potential of the node A $V_A$ of the differential amplifier 111 exceeds the threshold voltage $V_{th2}$. The third amplifier 132 outputs the control signal of a low level (for example, the GND level) when the potential of node A $V_A$ of the differential amplifier 111 exceeds the threshold voltage $V_{th2}$. Each control signal of the second amplifier 131 and the third amplifier 132 is supplied to the current supply unit 12 as the ON/OFF control signal for performing the ON/OFF control with respect to the third current source 125.

Here, a period during which the control signal of a low level is output from the second amplifier 131 is a period from a timing right before the shift of the differential amplifier 111 from the standby state to the operating state, to a timing right after the shift of the differential amplifier 111 from operating state to the standby state. In addition, a period during which the control signal of a low level is output from the third amplifier 132 is a period from a timing right after the control waveform $V_{Saw}$ exceeds the signal voltage $V_{Sig}$ (in this example, below), to a timing right before the control waveform $V_{Saw}$ exceeds the signal voltage $V_{Sig}$ again (in this example, over the signal voltage $V_{Sig}$).

The ON/OFF control unit 126 of the current supply unit 12 receives each of the control signals of the second amplifier 131 and the third amplifier 132, and performs the ON/OFF control with respect to the third current source 125 as follows. First, when the differential amplifier 111 is in the standby state, the third current source 125 is in the OFF state. Accordingly, when the differential amplifier 111 is in the standby state, the standby current $I_{Stby}$ output from the second current source 124 is directly supplied to the differential amplifier 111.

Next, at the timing right before the shift of the differential amplifier 111 from the standby state to the operating state, the third current source 125 is in the ON state in response to the control signal output from the second amplifier 131. Accordingly, the standby current $I_{Stby}$ output from the second current source 124 and the third current $I_{Drv}'$ output from the third current source 125 are added together, and supplied to the differential amplifier 111 as the driving current $I_{Drv}$.

Next, at the timing right after the control waveform $V_{Saw}$ exceeds the signal voltage $V_{Sig}$ (in this example, the control waveform $V_{Saw}$ is below the signal voltage $V_{Sig}$), the third current source 125 is in the OFF state in response to the control signal output from the third amplifier 132. Accordingly, the standby current $I_{Stby}$ output from the second current source 124 is supplied to the differential amplifier 111 right after the control waveform $V_{Saw}$ exceeds the signal voltage $V_{Sig}$.

Subsequently, at the timing right before the control waveform $V_{Saw}$ exceeds the signal voltage $V_{Sig}$ again (in this example, the control waveform $V_{Saw}$ is over the signal voltage $V_{Sig}$), and the third current source 125 is in the ON state. Accordingly, the standby current $I_{Stby}$ output from the second current source 124 and the third current $I_{Drv}'$ output from the third current source 125 are added together, and supplied to the differential amplifier 111 as the driving current $I_{Drv}$.

Next, at the timing right after the shift of the differential amplifier 111 from the operating state to the standby state, the third current source 125 is in the OFF state in response to the control signal output from the second amplifier 131. The standby current $I_{Stby}$ output from the second current source 124 is supplied to the differential amplifier 111 right after the differential amplifier 111 is shifted from the operating state to the standby state.

As described above, under the control according to the ON/OFF control unit 126, the control in which the driving current $I_{Drv}$ is supplied only in a short period before and after the comparative operation with respect to the differential amplifier 111, and the standby current $I_{Stby}$ is supplied in the other periods is performed on the basis of each of the control signals of the second amplifier 131 and the third amplifier 132.

Here, the comparative operation of the differential amplifier 111 is an operation for detecting that the control waveform $V_{Saw}$ exceeds the signal voltage $V_{Sig}$, and an operation for detecting that the control waveform $V_{Saw}$ exceeds the signal voltage $V_{Sig}$ again. In addition, the short period before and after the comparative operation is a period between right before the shift from the standby state to the operating state and right after the control waveform $V_{Saw}$ in excess of the signal voltage $V_{Sig}$, and a period between right before the control waveform $V_{Saw}$ in excess of the signal voltage $V_{Sig}$ again and right after the shift from the operating state to the standby state.

In the comparator circuit 10E according to Example 5 of the configuration described above, the same action and the same effect with the comparator circuit 10A according to Example 1 are able to be obtained. That is, it is possible to control the current according to the operating state of the differential circuit unit 11 without controlling the current by receiving the control signal from the outside, and thus the power consumption is able to be optimized according to the operating state of the differential circuit unit 11. Therefore, it is possible to reduce the power consumption of the comparator circuit. In addition, there is an advantage that wiring for transmitting the control signal at the time of controlling the current by receiving the control signal from the outside is not necessary.

In addition, in the comparator circuit 10E according to Example 5, the driving current $I_{Drv}$ is supplied only in the short period before and after performing the comparative operation with respect to the differential amplifier 111, and the standby current $I_{Stby}$ is supplied in the other period. Accordingly, even when the driving current $I_{Drv}$ is supplied over the whole period of the operating mode, it is possible to reduce the power consumption of the differential circuit unit 11, and to reduce the power consumption of the comparator circuit.

In a control method of the comparator circuit of the present disclosure, according to the control in the comparator circuits 10A to 10E of each Example described above, the operation timing of the differential circuit unit 11 is detected, and the current supplied to the differential circuit unit 11 by the current supply unit 12 is controlled according to the detection result.

Modification Example

Figure 14:
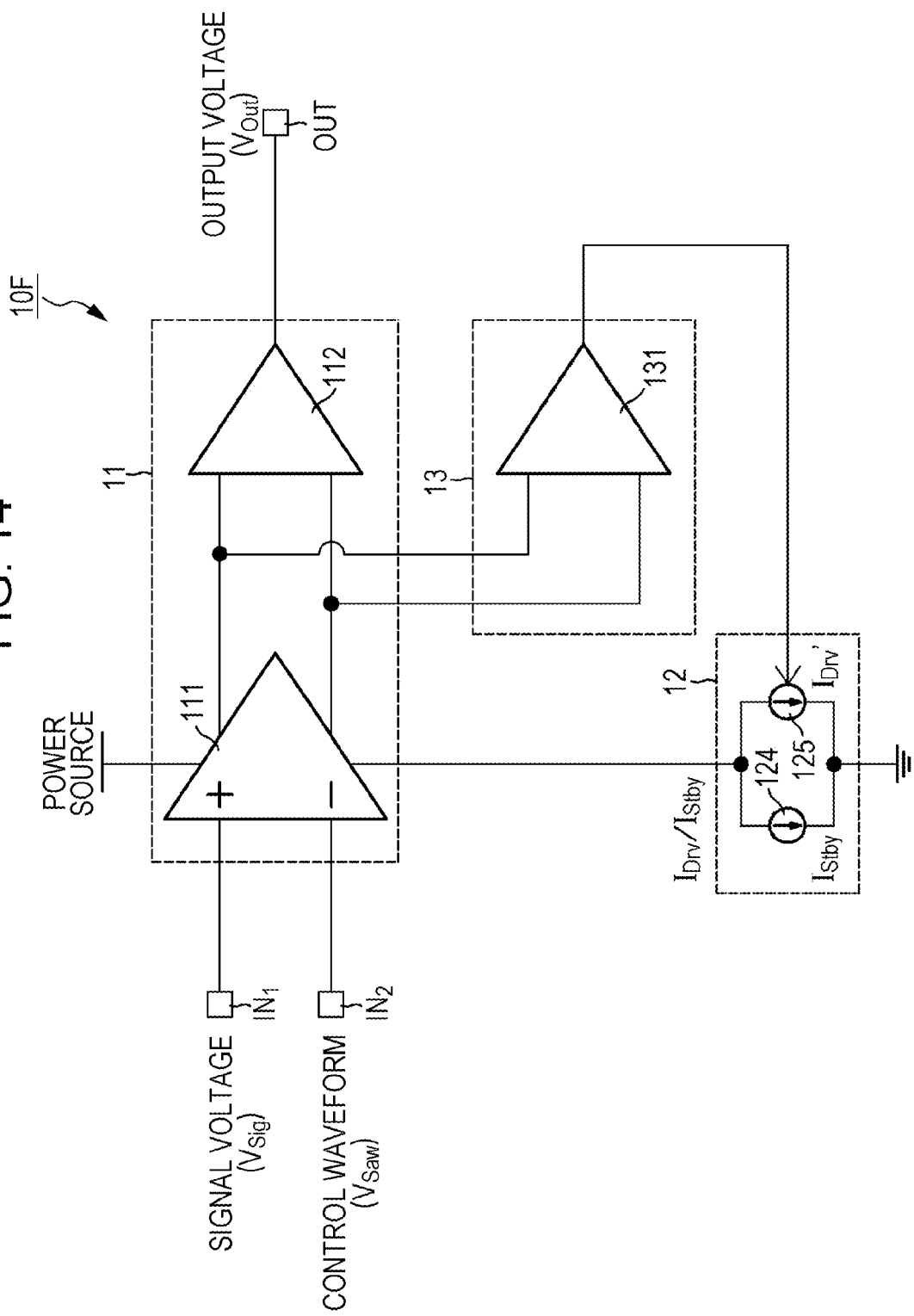
FIG. 14 is a circuit diagram illustrating a configuration of a comparator circuit according to a modification example of the present disclosure.

In each Example described above, a configuration in which the current supply unit 12 is disposed on the high potential side (for example, the power source voltage $V_{DD}$ side) is described as an example, but, with reference to Example 1, a configuration in which the current supply unit 12 is disposed on the low potential side (for example, the GND side) may be adopted (a comparator circuit 10F according to the modification example) as illustrated in FIG. 14.

Example 6

Figure 15:
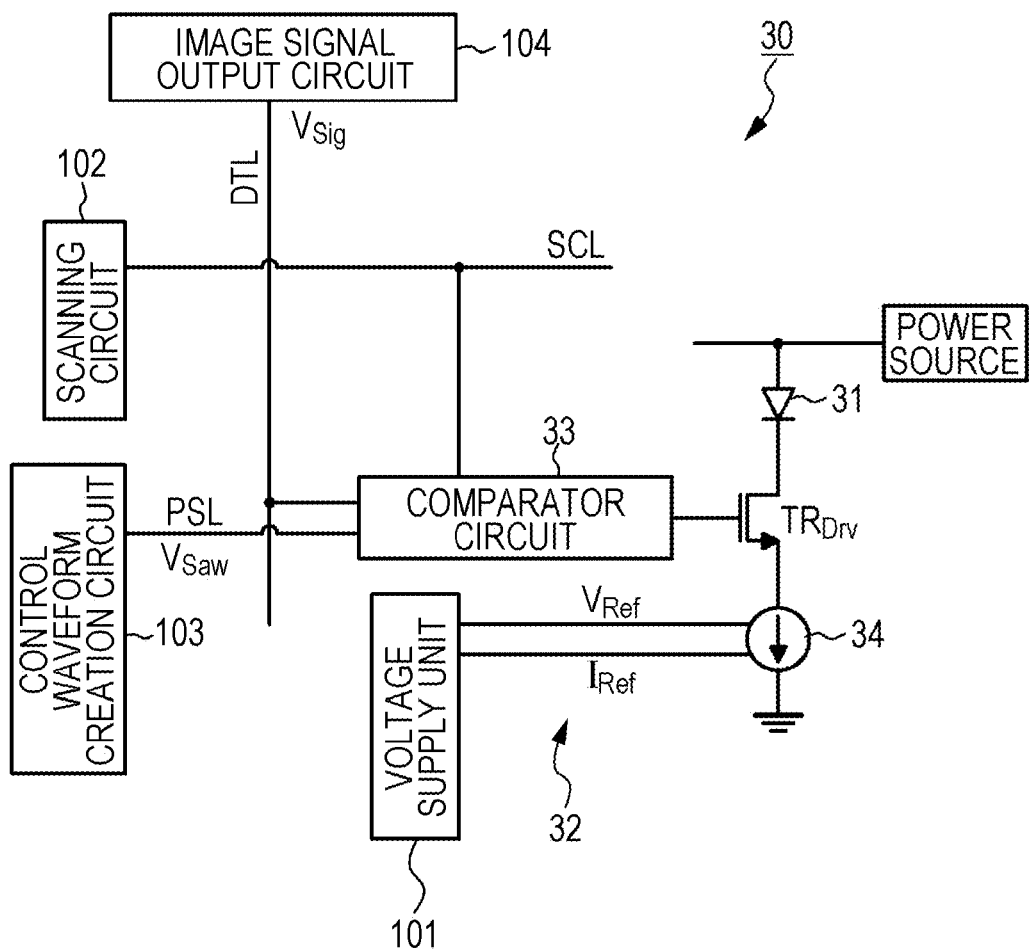
FIG. 15 is a conceptual diagram of a pixel or the like configured by a light emitting unit and a driving circuit in a display apparatus according to Example 6.
Figure 16:
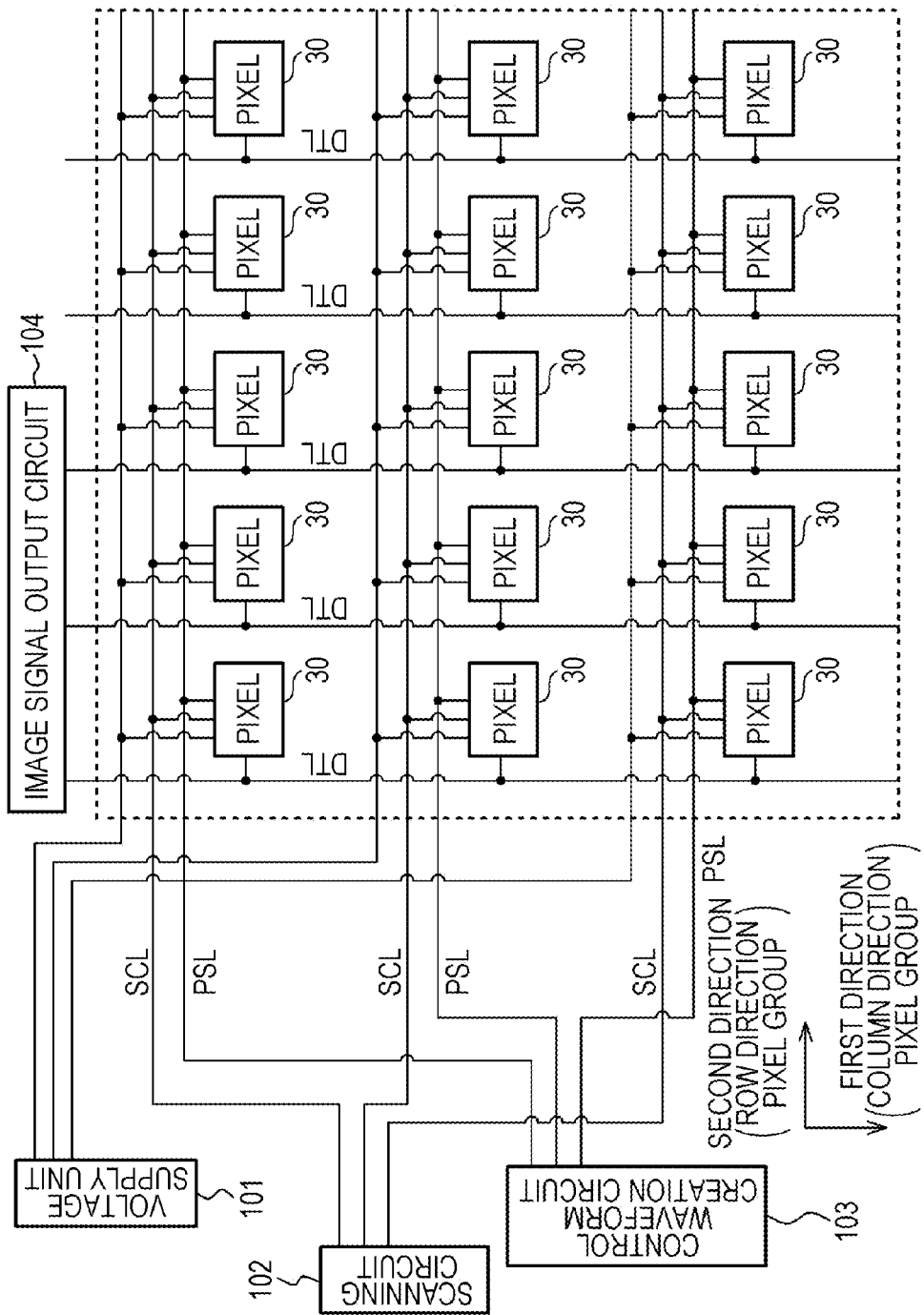
FIG. 16 is a conceptual diagram of a circuit for configuring the display apparatus according to Example 6.

A conceptual diagram of a pixel or the like configured by a light emitting unit and a driving circuit in a display apparatus according to Example 6 is illustrated in FIG. 15, and a conceptual diagram of a circuit for configuring the display apparatus according to Example 6 is illustrated in FIG. 16. Furthermore, for the sake of simplicity of the drawings, 3×5 pixels are illustrated in FIG. 16.

In the display apparatus according to Example 6, a plurality of pixels (more specifically, sub-pixels, the same is applied to the following) 30 configured by a light emitting unit 31, and a driving circuit 32 for driving the light emitting unit 31 is arranged in the shape of a two-dimensional matrix. Specifically, the plurality of pixels 30 is arranged in the shape of the two-dimensional matrix in a first direction and a second direction. Then, a pixel group is divided into P pixel blocks along the first direction. In addition, the display apparatus according to Example 6 includes a voltage supply unit 101, a scanning circuit 102, a control waveform creation circuit 103, and an image signal output circuit 104 as a peripheral driving unit for driving the pixel 30.

The light emitting unit 31 includes a light emitting diode (LED), and an anode electrode thereof is connected to a power source unit. Each driving circuit 32 of the plurality of pixels 30 includes a comparator circuit 33, a current source 34, and a light emitting unit driving transistor $TR_{Drv}$. The light emitting unit driving transistor $TR_{Drv}$ includes, for example, an N-channel type transistor. However, the light emitting unit driving transistor $TR_{Drv}$ is not limited to the N-channel type transistor. In the light emitting unit driving transistor $TR_{Drv}$, a drain electrode is connected to a cathode electrode of the light emitting unit 31, and a source electrode is connected to a ground portion (ground) through the current source 34.

The control waveform (a light emitting control waveform) $V_{Saw}$ having the voltage change of the saw tooth waveform is applied to the comparator circuit 33 from the control waveform creation circuit 103 through a control waveform line PSL, and the signal voltage (an intensity signal of light emitting) $V_{Sig}$ is applied to the comparator circuit 33 from the image signal output circuit 104 through a data line DTL. Furthermore, the signal voltage $V_{Sig}$ is, specifically, a projection signal voltage for controlling a light emitting state (brightness) of the pixel 30. The comparator circuit 33 compares potentials on the basis of the control waveform $V_{Saw}$ and the signal voltage $V_{Sig}$, and outputs a predetermined voltage (for convenience, referred to as a "first predetermined voltage") on the basis of the comparative result.

A reference voltage $V_{Ref}$ and a reference current $I_{Ref}$ are supplied to the current source 34 from the voltage supply unit 101. The current source 34 creates a constant current by performing a voltage current conversion on the basis of the reference voltage $V_{Ref}$ and the reference current $I_{Ref}$. The light emitting unit driving transistor $TR_{Drv}$ is driven by the first predetermined voltage output from the comparator circuit 33, and thus supplies the current to the light emitting unit 31, and causes the light emitting unit 31 to emit light. That is, the light emitting unit driving transistor $TR_{Drv}$ configures the current supply unit for supplying the current to the light emitting unit 31 according to the output of the comparator circuit 33.

Then, the comparator circuit 33 includes the comparator circuits 10A to 10E according to Example 1 to Example 5 described above, or the comparator circuit 10F according to the modification example. The display apparatus according to Example 6 adopts a driving method for causing the light emitting unit 31 to emit the light, that is, for performing PWM driving with respect to the light emitting unit 31 for a time period according to the potential on the basis of the signal voltage $V_{Sig}$ by including the driving circuit 32 provided with the comparator circuit 33 in each pixel 30. According to the PWM driving method, there is an advantage that a light emitting variation of the light emitting unit 31 is able to be lessened.

Figure 17:
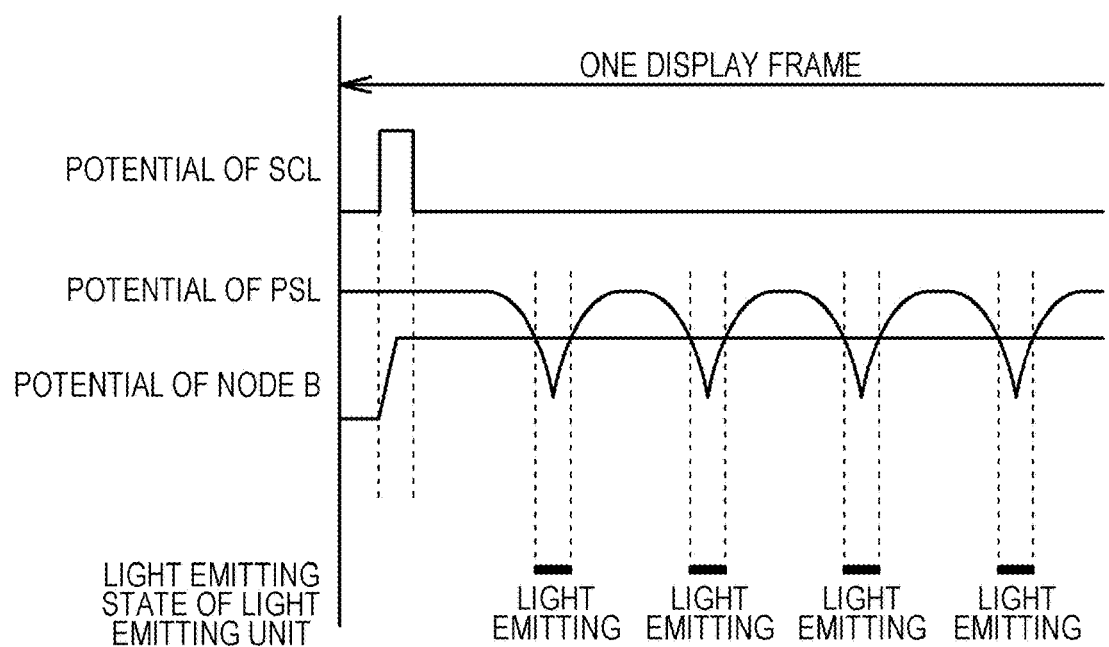
FIG. 17 is a schematic view illustrating a control waveform or the like for describing an operation of one pixel in the display apparatus according to Example 6.
Figure 18:
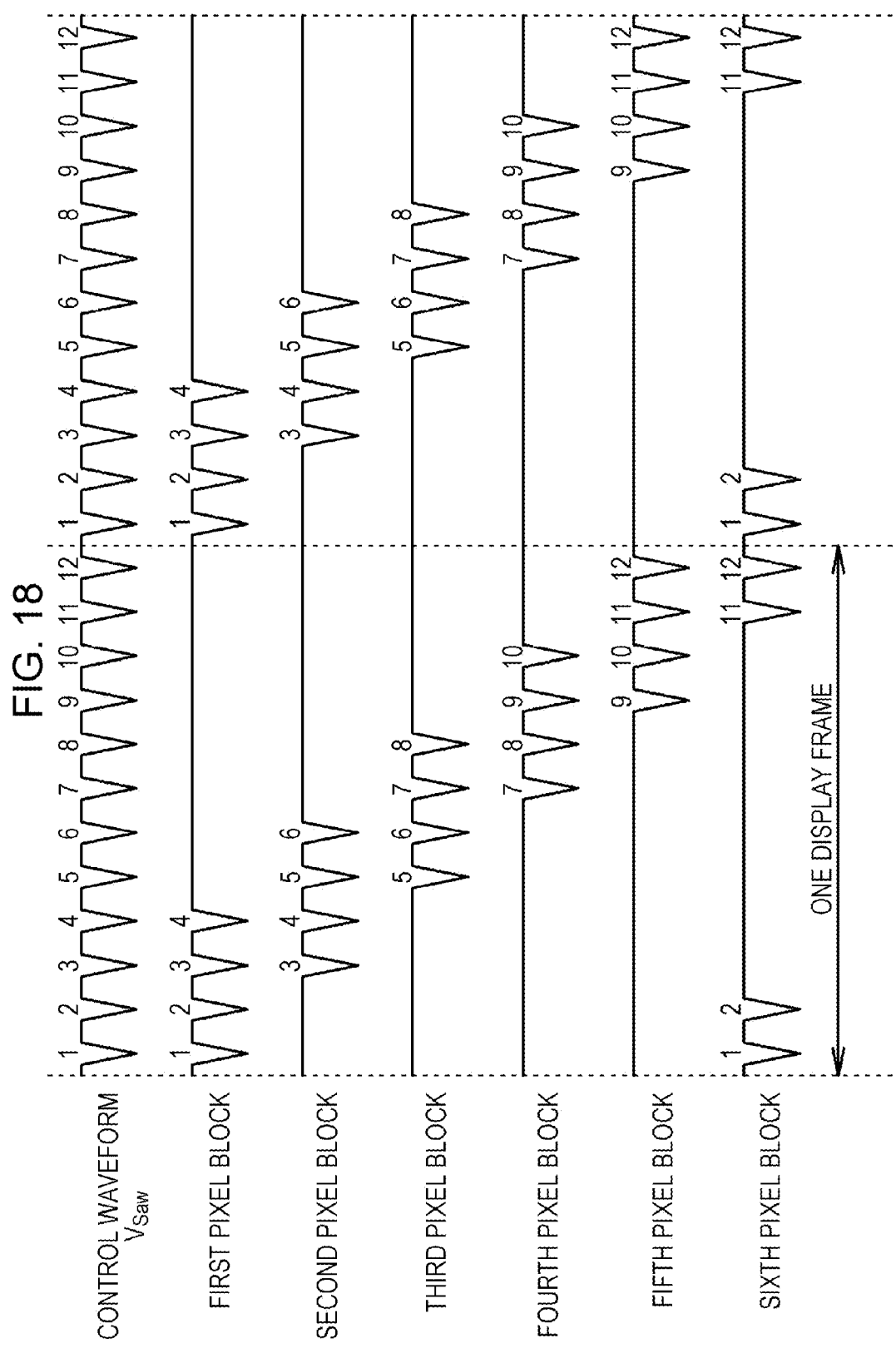
FIG. 18 is a schematic view illustrating a supply of a plurality of control waveforms with respect to a pixel block in the display apparatus according to Example 6.
Figure 19:
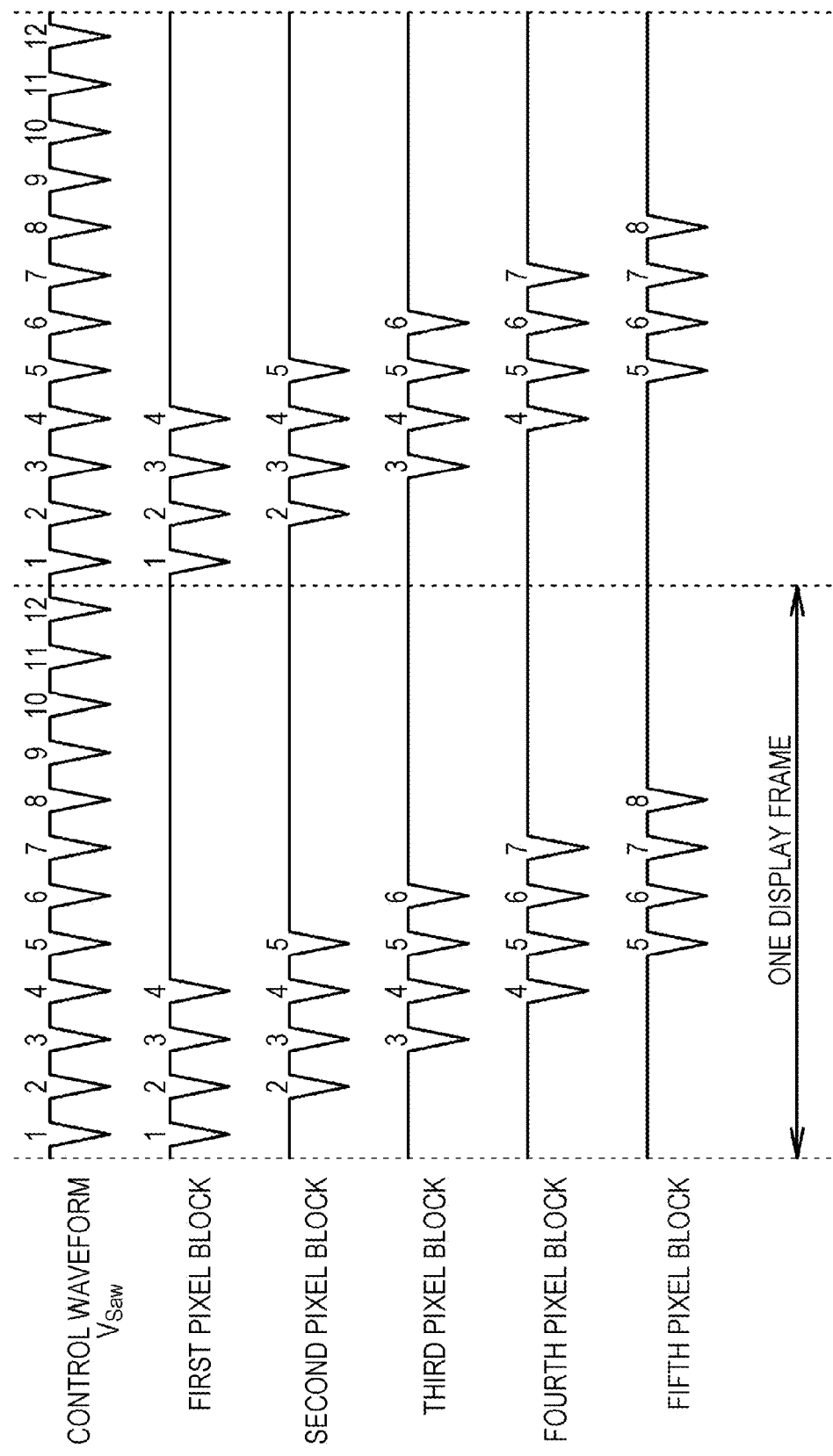
FIG. 19 is a schematic view illustrating a supply of a plurality of control waveforms with respect to a pixel block in a modification example of the display apparatus according to Example 6.

In FIG. 17, a schematic view illustrating a control waveform $V_{Saw}$ or the like for describing an operation of one pixel in the display apparatus according to Example 6 is illustrated. In addition, a schematic view illustrating a supply of a plurality of control waveforms $V_{Saw}$ with respect to a pixel block is illustrated in FIG. 18. In FIG. 18 and FIG. 19 described later, the saw tooth waveform of the control waveform $V_{Saw}$ is illustrated in the shape of a triangle for convenience.

The display apparatus according to Example 6 is a display apparatus in which the plurality of pixels 30 including the light emitting unit 31, and the driving circuit 32 for driving the light emitting unit 31 is arranged in the shape of the two-dimensional matrix in the first direction and the second direction, and the pixel group is divided into the P pixel blocks along the first direction. Then, the light emitting unit 31 configuring the pixel 30 belonging to a first pixel block to the light emitting unit 31 configuring the pixel 30 belonging to a P-th pixel block in each pixel block sequentially and concurrently emit the light, and when the light emitting unit 31 configuring the pixel 30 belonging to a part of the pixel block emits the light, the light emitting unit 31 configuring the pixel 30 belonging to the remaining pixel blocks does not emit the light.

For example, a full-HD high-definition full-color display apparatus in which the number of pixels in a horizontal direction (the second direction) of a screen is 1920, and the number of pixels in a vertical direction (the first direction)

of the screen is 1080 is assumed. The pixel group is divided into the P pixel blocks along the first direction. Here, as an example, P=6 is set. Then, a first pixel group to a 180th pixel group are included in the first pixel block, a 181st pixel group to a 360th pixel group are included in a second pixel block, a 361st pixel group to a 540th pixel group are included in a third pixel block, a 541st pixel group to a 720th pixel group are included in a fourth pixel block, a 721st pixel group to a 900th pixel group are included in a fifth pixel block, and a 901st pixel group to a 1080th pixel group are included in a sixth pixel block.

Hereinafter, an operation of each pixel in the first pixel block will be described.

Signal Voltage Writing Period

In the first pixel block, the driving circuits 32 in all of the pixels (a column direction pixel group) belonging to one row arranged in the second direction are concurrently in an actuation state. Then, an operation in which the driving circuits 32 in all of the pixels (the column direction pixel group) belonging to one row arranged in the second direction are concurrently in the actuation state in the first pixel block is sequentially performed from the driving circuits 32 in all of the pixels (the column direction pixel group of a first column) belonging to a first column arranged in the first direction to the driving circuits 32 in all of the pixels (the column direction pixel group of a last column) belonging to the last column (specifically, a 180th column).

Pixel Block Light Emitting Period

In the first pixel block, when the above operation is completed, the control waveform $V_{Saw}$ is supplied to the first pixel block from the control waveform creation circuit 103. That is, the driving circuits 32 configuring all of the pixels 30 in the first pixel block are concurrently in the actuation state, and the light emitting units 31 in all of the pixels 30 belonging to the first pixel block emit the light. An absolute value of the voltage of one control waveform $V_{Saw}$ decreases (is lowered) over time, and subsequently increases (is lifted). Then, a gamma correction is performed according to the voltage of the control waveform $V_{Saw}$ changing over time. That is, an absolute value of a change ratio (a differential value) of the voltage of the control waveform $V_{Saw}$ having a time variable is proportionate to a constant number of 2.2.

In an example illustrated in FIG. 17, the voltage of the control waveform $V_{Saw}$ in a signal voltage writing period is, for example, higher than or equal to 3 Volts. Accordingly, in the signal voltage writing period, the comparator circuit 33 (10A to 10E) outputs a second predetermined voltage (a low level) from an output unit, and thus the light emitting unit driving transistor $TR_{Drv}$ is in the OFF state. In the pixel block light emitting period, the voltage of the control waveform $V_{Saw}$ starts to be lowered, and when the voltage of the saw tooth waveform of the control waveform $V_{Saw}$ arrives at the potential on the basis of the signal voltage $V_{Sig}$, the comparator circuit 33 (10A to 10E) outputs a first predetermined voltage (a high level) from the output unit. As a result, the light emitting unit driving transistor $TR_{Drv}$ is in the ON state, the current is supplied to the light emitting unit 31 from the power source unit, and the light emitting unit 31 emits the light.

The voltage of the control waveform $V_{Saw}$ is lowered to approximately 1 Volt, and subsequently, lifted. Then, when the voltage of the saw tooth waveform of the control waveform $V_{Saw}$ exceeds the potential on the basis of the signal voltage $V_{Sig}$, the comparator circuit 33 (10A to 10E) outputs the second predetermined voltage (the low level) from the output unit. As a result, the light emitting unit driving transistor $TR_{Drv}$ is in the OFF state, the supply of the current with respect to the light emitting unit 31 from the power source unit is blocked, and the light emitting unit 31 stops emitting the light (extinction). That is, only within a time period during which the potential on the basis of the signal voltage (the intensity signal of light emitting) $V_{Sig}$ cuts out the saw tooth waveform of the control waveform $V_{Saw}$, the light emitting unit 31 is able to emit the light. Then, brightness of the light emitting unit 31 at this time depends on the length of the time period during which the potential is cut out.

That is, the time period during which the light emitting unit 31 emits the light is, for example, based on the signal voltage $V_{Sig}$ applied from the image signal output circuit 104, and the voltage of the control waveform $V_{Saw}$ applied from the control waveform creation circuit 103. Then, the gamma correction is performed according to the voltage of the saw tooth waveform of the control waveform $V_{Saw}$ changing over time. That is, the absolute value of the change ratio of the voltage of the control waveform $V_{Saw}$ having a time variable is proportionate to the constant number of 2.2, and thus it is not necessary to dispose a circuit for the gamma correction. For example, a method in which the signal voltage $V_{Sig}$ is changed with the 2.2th power of a line shaped brightness signal by using a control waveform $V_{Saw}$ having a voltage of a line shaped saw tooth waveform (a triangle waveform) is considered, but in practice, the voltage change in low brightness is too small, and particularly, a large number of bits is necessary to realize such a voltage change in a digital process, and thus the method is not effective.

In the display apparatus according to Example 6, one control waveform creation circuit 103 is provided. The voltage of the control waveform $V_{Saw}$ is most precipitously changed in a low gradation portion (a low voltage portion) as schematically illustrated in FIG. 17, and particularly, is sensitive with respect to the waveform grade of the control waveform $V_{Saw}$ in this portion. Accordingly, it is necessary to consider the variation of the control waveform $V_{Saw}$ created in the control waveform creation circuit 103. However, in the display apparatus according to Example 6, the number of provided control waveform creation circuits 103 is not one, and thus the variation is not substantially generated in the control waveform $V_{Saw}$ created in the control waveform creation circuit 103. That is, the entire display apparatus is able to emit the light by the same control waveform $V_{Saw}$, and thus it is possible to prevent the variation of the light emitting state from being generated.

In addition, since the absolute value of the voltage of the control waveform $V_{Saw}$ decreases over time, and subsequently increases, the light emitting unit for configuring all of the pixels (more specifically, all of the sub-pixels) belonging to one pixel block is able to emit the light at the same timing. That is, it is possible to align (match) a temporal center of the light emitting of the light emitting unit configuring all of the pixels belonging to each pixel block. For this reason, it is possible to reliably prevent an occurrence of a vertical line (a vertical string) on an image due to a delay of the light emitting in a row direction pixel group.

In the display apparatus according to Example 6, the light emitting unit 31 emits the light multiple times on the basis of the plurality of control waveforms $V_{Saw}$. Alternatively, the light emitting unit 31 emits the light multiple times on the basis of the plurality of control waveforms $V_{Saw}$ having the voltage change of the saw tooth waveform supplied to the driving circuit 32, and the potential on the basis of the signal voltage $V_{Sig}$. Alternatively, in the control waveform creation circuit 103, the light emitting unit 31 emits the light multiple times on the basis of the plurality of control waveforms $V_{Saw}$. A time interval of the plurality of control waveforms $V_{Saw}$ is constant. Specifically, in the display apparatus according to Example 6, four control waveforms $V_{Saw}$ are transmitted to all of the pixels 30 configuring each pixel block in the pixel block light emitting period, and each of the pixels 30 emits the light four times.

As schematically illustrated in FIG. 18, in the display apparatus according to Example 6, 12 control waveforms $V_{Saw}$ are supplied to six pixel blocks in one display frame. Then, the number of control waveforms $V_{Saw}$ supplied to the driving circuit 32 in the one display frame is smaller than the number of control waveforms $V_{Saw}$ in the one display frame. Alternatively, in the control waveform creation circuit 103, the number of control waveforms $V_{Saw}$ supplied to the driving circuit 32 in the one display frame is smaller than the number of control waveforms $V_{Saw}$ in the one display frame. Specifically, in an example illustrated in FIG. 18, the number of control waveforms $V_{Saw}$ in the one display frame is 12, and the number of control waveforms $V_{Saw}$ supplied to the driving circuit 32 in the one display frame is 4. In the adjacent pixel blocks, two control waveforms $V_{Saw}$ are overlapped. That is, two adjacent pixel blocks are in the light emitting state at the same time. In addition, the first pixel block and the last pixel block are in the light emitting state at the same time. Such a conformation is able to be attained by creating a series of the plurality of control waveforms $V_{Saw}$ in the one display frame, by masking a part of the series of the plurality of control waveforms $V_{Saw}$ at the time of the light emitting of the light emitting unit 31 configuring the pixel 30 belonging to one pixel block, and by not supplying the control waveform $V_{Saw}$ to the driving circuit 32 configuring the pixel 30 belonging to the one pixel block. Specifically, for example, a part (four consecutive control waveforms $V_{Saw}$) may be taken out from the series of control waveforms $V_{Saw}$ in the one display frame by using a multiplexer, and may be supplied to the driving circuit 32.

That is, in the display apparatus in which the plurality of pixels 30 is arranged in the shape of the two-dimensional matrix in the first direction and the second direction, and the pixel group is divided into the P pixel blocks along the first direction, the control waveform creation circuit 103 according to Example 6 is the control waveform creation circuit for controlling the driving circuit 32 which creates the control waveform $V_{Saw}$ having the voltage change of the saw tooth waveform. Then, the control waveform creation circuit 103 sequentially and concurrently supplies the control waveform $V_{Saw}$ to the driving circuit 32 configuring the pixel 30 belonging to the first pixel block to the driving circuit 32 configuring the pixel 30 belonging to the P-th pixel block in each pixel block, and does not supply the control waveform $V_{Saw}$ to the driving circuit 32 configuring the pixel 30 belonging to the remaining pixel blocks when the control waveform $V_{Saw}$ is supplied to the driving circuit 32 configuring the pixel 30 belonging to a part of the pixel blocks. Here, in the control waveform creation circuit 103, the series of the plurality of control waveforms $V_{Saw}$ is created in the one display frame, a part of the series of the plurality of control waveforms $V_{Saw}$ is masked when the light emitting unit 31 configuring the pixel 30 belonging to the one pixel block does not emit the light, and does not supply the control waveform $V_{Saw}$ to the driving circuit 32 configuring the pixel 30 belonging to the one pixel block.

Figure 20:
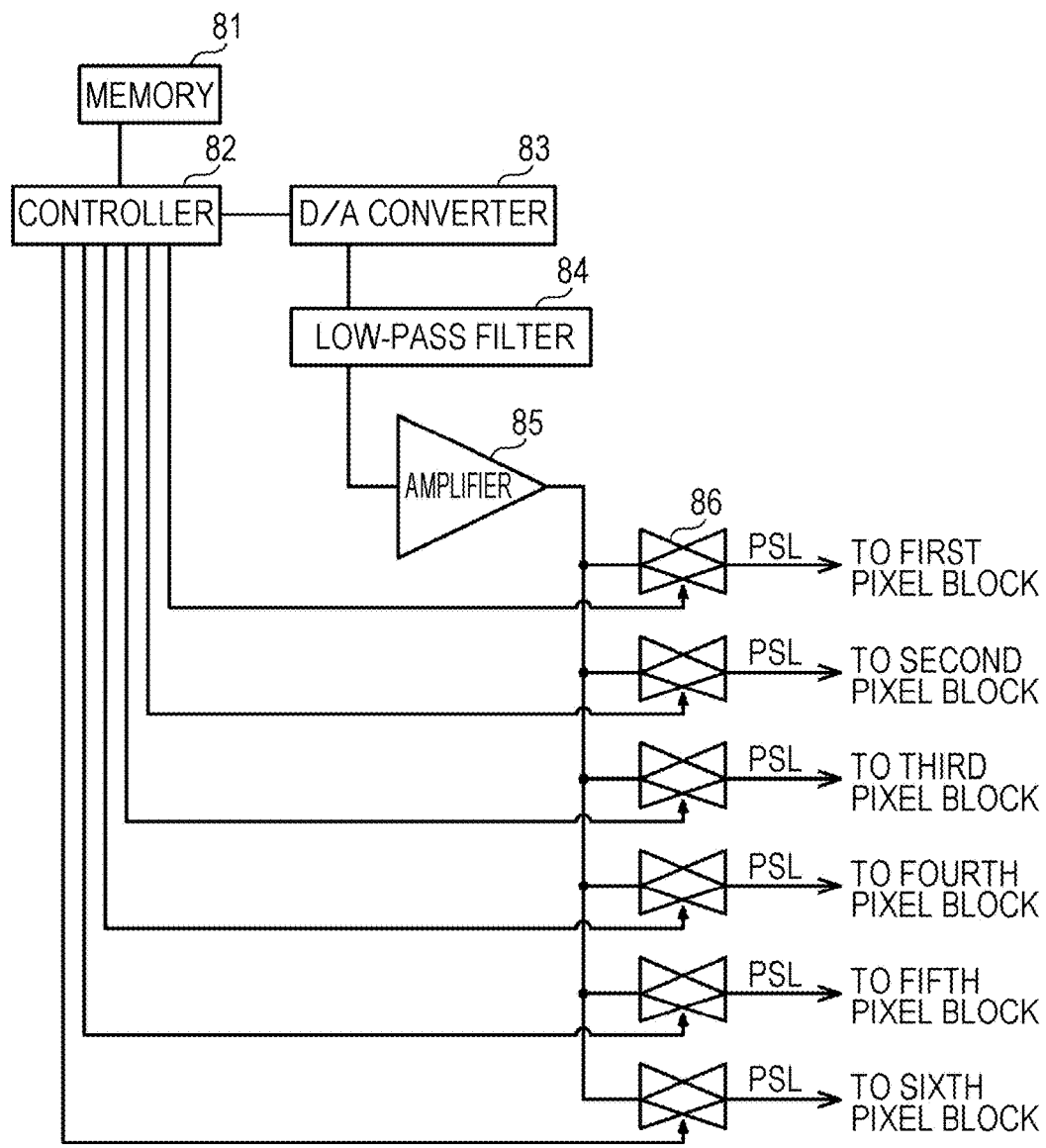
FIG. 20 is a conceptual diagram of a control waveform creation circuit in the display apparatus according to Example 6.

More specifically, as a conceptual diagram illustrated in FIG. 20, in the control waveform creation circuit 103, waveform data of the control waveform $V_{Saw}$ stored in a memory 81 is read out by a controller 82, and the read out waveform data is transmitted to a D/A converter 83. Then, the data is converted into a voltage by the D/A converter 83, and the voltage is integrated by a low-pass filter 84, and thus the control waveform $V_{Saw}$ having a curve of the 2.2th power is prepared.

Then, the control waveform $V_{Saw}$ is distributed into a plurality of (6 in Example 6) multiplexers 86 through the amplifier 85, passes through only a part which is desired in the series of control waveforms $V_{Saw}$ by the multiplexer 86, and masks the other part under the control according to the controller 82. Thus, a desired control waveform group (specifically, six sets of control waveform groups including the four consecutive control waveforms $V_{Saw}$) is prepared. Furthermore, since the number of base saw tooth waveforms is one, it is possible to reliably inhibit the occurrence of the variation in the creation of the control waveform $V_{Saw}$ in the control waveform creation circuit 103.

Then, an operation in the signal voltage writing period and the pixel block light emitting period described above is sequentially executed from the first pixel block to the sixth pixel block. That is, as illustrated in FIG. 18, the light emitting unit 31 configuring the pixel 30 belonging to the first pixel block to the light emitting unit 31 configuring the pixel 30 belonging to the P-th pixel block in each pixel block sequentially and concurrently emit the light. Furthermore, when the light emitting unit 31 configuring the pixel 30 belonging to a part of the pixel block emits the light, the light emitting unit 31 configuring the pixel 30 belonging to the remaining pixel block does not emit the light. Furthermore, in the one display frame, any of the pixel blocks constantly emits the light.

In this regard, a driving method of the related art in which the projection signal voltage is written in all of the pixels while the light emitting of all of the pixels is stopped in an initial first period of one display frame period, and the light emitting unit of all of the pixels emits the light within at least one light emitting period determined by the projection signal voltage written in each pixel in a second period, includes the following problem. That is, the projection signal may be equally transmitted over a time period of the entire one display frame, in a usual case. Accordingly, in a television image reception system, a method in which a vertical blanking zone is allocated to the second period, and all of the pixels emit the light at the same time is considered. However, in general, the vertical blanking zone is a time length of approximately 4% of the one display frame. For this reason, the display apparatus may have extremely low light emitting efficiency. In addition, it is necessary to prepare a large signal buffer in order to write the projection signal transmitted over the one display frame in all of the pixels in the first period, and it is necessary to devise a signal transmission circuit in order to transmit the projection signal to each pixel at a speed higher than or equal to a rate of the projection signal to be transmitted. Further, there is a problem in which all of the pixels concurrently emit the light in the second period, and thus power to be used in the light emitting may be concentrated in a short period of time, and it may be difficult to design the power source.

In this regard, in the display apparatus according to Example 6, when the light emitting unit 31 configuring the pixel 30 belonging to a part of a pixel block (for example, the first and the second pixel blocks) emits the light, the light emitting unit 31 configuring the pixel 30 belonging to the remaining pixel block (for example, the third to the sixth pixel blocks) does not emit the light. Accordingly, in the drive of the display apparatus on the basis of the PWM driving method, it is possible to increase the light emitting period, and thus to improve light emitting efficiency.

Furthermore, it is not necessary to concurrently write the projection signal to be transmitted over the one display frame in all of the pixels 30 in a certain period, that is, the projection signal to be transmitted over the one display frame may be sequentially written in each column direction pixel group similar to the display apparatus of the related art, and thus it is not necessary to prepare the large signal buffer. In addition, it is not necessary to devise the signal transmission circuit in order to transmit the projection signal to each pixel at the speed higher than or equal to the rate of the projection signal to be transmitted.

Further, in the light emitting period of the pixel, since all of the pixels 30 do not concurrently emit the light, that is, for example, when the light emitting unit configuring the pixel belonging to the first and the second pixel blocks emits the light, the light emitting unit configuring the pixel belonging to the third to sixth pixel blocks does not emit the light. Accordingly, the power to be used in the light emitting is not concentrated in a short period of time, and thus the power source can be easily designed.

In FIG. 19, the supply of the plurality of control waveforms $V_{Saw}$ with respect to the pixel block in the modification example of the display apparatus according to Example 6 is schematically illustrated, and in this example, P=5 is set. That is, a first pixel group to a 216th pixel group are included in the first pixel block, a 217th pixel group to a 432th pixel group are included in the second pixel block, a 433th pixel group to a 648th pixel group are included in the third pixel block, a 649th pixel group to a 864th pixel group are included in the fourth pixel block, and a 865th pixel group to a 1080th pixel group are included in the fifth pixel block.

In the example illustrated in FIG. 19, four control waveforms $V_{Saw}$ are transmitted to all of the pixels 30 configuring each pixel block in the pixel block light emitting period, and each of the pixels 30 emits the light four times. In the one display frame, 12 control waveforms $V_{Saw}$ are supplied to five pixel blocks. Then, the number of control waveforms $V_{Saw}$ supplied to the driving circuit 32 in the one display frame is smaller than the number of control waveform $V_{Saw}$ in the one display frame. Specifically, in the example illustrated in FIG. 19, the number of control waveforms $V_{Saw}$ in the one display frame is 12, and the number of control waveform $V_{Saw}$ supplied to the driving circuit 22 in the one display frame is 4. However, unlike the example illustrated in FIG. 18, there are pixel blocks which do not emit the light in the one display frame. In the adjacent pixel blocks, three control waveforms $V_{Saw}$ are overlapped. Then, in the five pixel blocks, the light emitting states are overlapped in a maximum of four pixel blocks. Thus, a plurality of pixel blocks of which the number is larger than that of the example illustrated in FIG. 18 is in the light emitting state at the same time, and thus it is possible to further improve image display quality.

In the display apparatus for driving the light emitting unit 31 to emit the light under the drive according to the PWM driving method as described above, the following actions and effects are able to be obtained by using the comparator circuits 10A to 10E according to Example 1 to Example 5, or the comparator circuit 10F according to the modification example as the comparator circuit 33 disposed in each of the pixels 30.

That is, the comparator circuits 10A to 10E according to Example 1 to Example 5, or the comparator circuit 10F according to the modification example are able to reduce the power consumption. Accordingly, in the display apparatus in which the comparator circuit 33 is disposed in each of the pixels 30, it is possible to considerably reduce the power consumption of the entire display apparatus.

In addition, in the comparator circuits 10A to 10E according to Example 1 to Example 5, or the comparator circuit 10F according to the modification example, the control unit 13 for controlling the current is embedded, and thus the wiring for transmitting the control signal at the time of controlling the current by receiving the control signal from the outside is not necessary. Accordingly, in the display apparatus in which the comparator circuit 33 is disposed in each of the pixels 30, the number of wire lines is able to be considerably reduced.

Example 7

Next, Example 7 in which the comparator circuits 10A to 10E according to Example 1 to Example 5 are used as the comparator circuit disposed in the input stage of the A/D conversion circuit will be described. In Example 7, a case where any one of the comparator circuits 10A to 10E according to Example 1 to Example 5 is used as the A/D conversion circuit of the solid state imaging apparatus in the serial-parallel A/D conversion method is described as an example.

Figure 21:
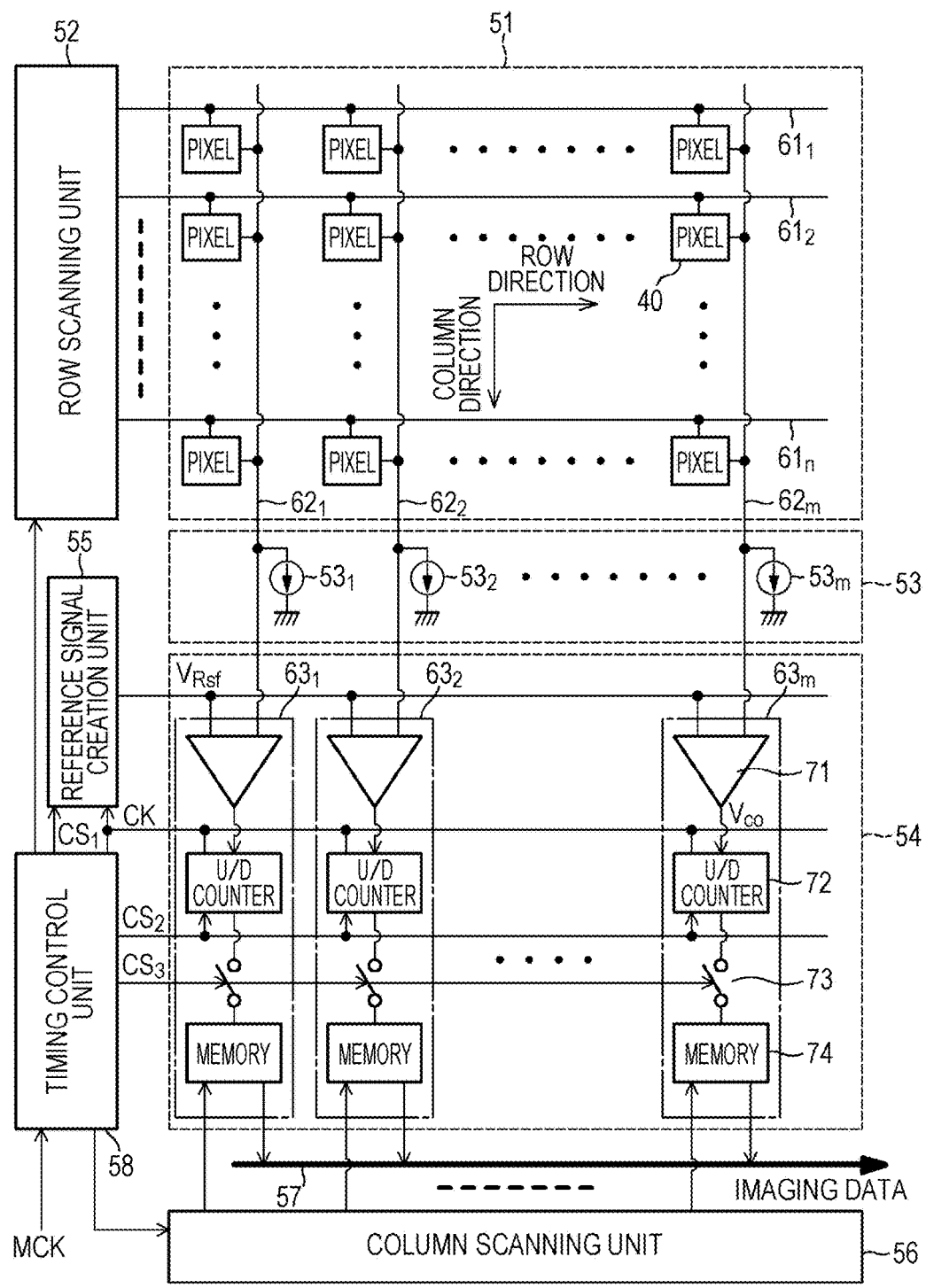
FIG. 21 is a system configuration diagram schematically illustrating a configuration of a solid state imaging apparatus of a serial-parallel A/D conversion method according to Example 7.

FIG. 21 is a system configuration diagram schematically illustrating a configuration of a solid state imaging apparatus according to Example 7, for example, a CMOS image sensor which is a type of a solid state imaging apparatus of an X-Y address method. Here, the CMOS image sensor is an image sensor which is prepared by applying a CMOS process, or by partially using the CMOS process.

System Configuration

As illustrated in FIG. 21, the CMOS image sensor according to Example 4 includes a pixel array portion 51 in which a plurality of pixels 40 is arranged in the shape of a two-dimensional matrix, and a peripheral drive system or signal processing system which drives each pixel 40 of the pixel array portion 51. In this example, as the peripheral drive system or signal processing system, for example, a column scanning unit 52, a current source unit 53, a column processing unit 54, a reference signal creation unit 55, a row scanning unit 56, a horizontal output line 57, and a timing control unit 58 are disposed. The peripheral drive system or signal processing system is integrated on the same semiconductor substrate (a chip) as the pixel array portion 51.

In this system configuration, the timing control unit 58 creates a clock signal CK, control signals $CS_1$ to $CS_3$, or the like which are a basis of operations of the column scanning unit 52, the column processing unit 54, the reference signal creation unit 55, the row scanning unit 56, and the like on the basis of a master clock MCK. The clock signal CK, the control signals $CS_1$ to $CS_3$, or the like created in the timing control unit 58 are applied to the column scanning unit 52, the column processing unit 54, the reference signal creation unit 55, the row scanning unit 56, and the like as a driving signal.

The pixel array portion 51 has a configuration in which the pixel 40 including a photoelectric conversion unit which creates and accumulates an optical charge according to a received light amount is arranged in a column direction and a row direction, that is, in the shape of a two-dimensional matrix. Here, the column direction indicates an arrangement direction (that is, the horizontal direction) of the pixel in a pixel column, and the row direction indicates an arrangement direction (that is, the vertical direction) of the pixel in a pixel row.

In the pixel array portion 51, a column control line (61₁ to 61ₙ) in each pixel column is wired along the column direction, and a row signal line 62 (62₁ to 62ₘ) in each pixel row is wired along the row direction in the matrix shaped pixel arrangement. The column control line 61 transmits the control signal for performing control at the time of reading out the signal from the pixel 40. In FIG. 21, in the column control line 61, one wire line is illustrated, but the number of wire lines is not limited to one. Each one end of the column control lines 61₁ to 61ₙ is connected to each output end corresponding to each column of the column scanning unit 52. Current sources 53₁ to 53ₘ are connected to the row signal lines 62₁ to 62ₘ.

The column scanning unit 52 is configured by a shift resister, an address decoder, or the like, and drives each pixel 40 of the pixel array portion 51 at the same time in all of the pixels, or in a column unit or the like. That is, the column scanning unit 52 configures a driving unit for driving each of the pixels 40 of the pixel array portion 51 along with the timing control unit 58 for controlling the column scanning unit 52. A specific configuration of the column scanning unit 52 is not illustrated, but the column scanning unit 52 generally includes two scanning systems of a reading scanning system and a scraping scanning system.

The reading scanning system sequentially and selectively scans each of the pixels 40 of the pixel array portion 51 in the column unit to read out the signal from the pixel 40. The signal read out from the pixel 40 is an analog signal. The scraping scanning system performs a scraping scanning with respect to the read column in which a reading scanning is performed by the reading scanning system, ahead of the reading scanning by a time period of a shutter speed. According to the scraping scanning by the scraping scanning system, an unnecessary charge from the photoelectric conversion unit of the pixel 40 in the read column is scraped out, and thus the photoelectric conversion unit is reset. Then, by scraping out (resetting) the unnecessary charge according to the scraping scanning system, a so-called electronic shutter operation is performed. Here, the electronic shutter operation indicates an operation for dropping the optical charge of the photoelectric conversion unit, and for starting a new lithographic exposure operation (starting accumulation of the optical charge).

The signal read out according to a reading operation by the reading scanning system corresponds to the light amount received after an immediately previous reading operation or the electronic shutter operation. Then, a period from a reading timing according to the immediately previous reading operation or a scraping timing according to the electronic shutter operation to a reading timing according to a current reading operation is a lithographic exposure period of the optical charge in the pixel 40.

The column processing unit 54 includes an A/D conversion circuit 63 (63₁ to 63ₘ) disposed in, for example, each pixel row of the pixel array portion 51, that is, each row signal line 62 (62₁ to 62ₘ) with a correspondence relationship of one for one. The A/D conversion circuit 63 (63₁ to 63ₘ) converts the analog signal (a pixel signal) which is output from each of the pixels 40 of the pixel array portion 51 to each row through the row signal lines 62₁ to 62ₘ into a digital signal.

The reference signal creation unit 55 creates a reference signal $V_{Ref}$ of a so-called ramp (RAMP) waveform in which a voltage value is changed in the shape of a step over time. The reference signal creation unit 55 is able to be configured by using, for example, a D/A (digital/analog) conversion circuit. Furthermore, the configuration of the reference signal creation unit 55 is not limited to the configuration using the D/A conversion circuit.

Under the control according to the control signal CS₁ applied from the timing control unit 58, the reference signal creation unit 55 creates the reference signal $V_{ref}$ of a ramp wave on the basis of the clock signal CK applied from the timing control unit 58. Then, the reference signal creation unit 55 supplies the created reference signal $V_{Ref}$ to the A/D conversion circuits 63₁ to 63ₘ of the column processing unit 54.

All of the A/D conversion circuits 63₁ to 63ₘ have the same configuration. Here, the A/D conversion circuit 63ₘ will be described as an example of a specific configuration of the A/D conversion circuit 63. The A/D conversion circuit 63ₘ includes a comparator circuit 71, for example, an up/down counter (in the drawing, referred to as an "U/D counter") 72 which is a counting unit, a transmission switch 73, and a memory apparatus 74.

The comparator circuit 71 compares a signal voltage $V_{Out}$ of the row signal line 62ₘ according to the pixel signal output from each n-th row pixel 40 in a pixel array portion 51, and the reference signal $V_{Ref}$ of the ramp wave supplied from the reference signal creation unit 55. Then, an output $V_{co}$ of the comparator circuit 71, for example, is in a low level when the reference signal $V_{Ref}$ is higher than the signal voltage $V_{Out}$, and is in a high level when the reference signal $V_{Ref}$ is lower than or equal to the signal voltage $V_{Out}$.

The up/down counter 72 is an asynchronous counter, and the clock signal CK from the timing control unit 58 is applied to the up/down counter 72 and the reference signal creation unit 55 at the same time under the control according to the control signal CS₂ applied from the timing control unit 58. Then, the up/down counter 72 performs a down (DOWN) count or an up (UP) count in synchronization with the count clock signal CK, and thus measures a comparative period from the start of the comparative operation to the end of the comparative operation in the comparator circuit 71.

The transmission switch 73 is in an ON (closed) state when the count operation of the up/down counter 72 is completed with respect to the pixel 40 in a certain column, under the control according to the control signal CS₃ applied from the timing control unit 58. Then, the transmission switch 73 transmits a count result of the up/down counter 72 to the memory apparatus 74.

Thus, in the A/D conversion circuit 63 (63₁ to 63ₘ), first, the comparative operation is performed by the comparator circuit 71 with respect to the analog signal which is supplied to each pixel row from each pixel 40 of the pixel array portion 51 through the row signal lines 62₂ to 62ₘ. Then, in the up/down counter 72, the count operation is performed from the start of the comparative operation to the end of the comparative operation of the comparator circuit 71, and thus the analog signal is converted into the digital signal and stored in the memory apparatus 74.

The row scanning unit 56 is configured by the shift resister, the address decoder, or the like, and controls a row address or a row scanning of the A/D conversion circuits 63₁ to 63ₘ in the column processing unit 54. Under the control according to the row scanning unit 56, the A/D converted digital signal in each of the A/D conversion circuits 63₁ to 63ₘ is sequentially read to the horizontal output line 57, and output as imaging data through the horizontal output line 57.

Furthermore, in the configuration example described above, a configuration of the column processing unit 54 in which the A/D conversion circuit 63 is disposed in each row signal line 62 with the correspondence relationship of one for one is described as an example, but the disposition is not limited to the correspondence relationship of one for one. For example, a configuration in which a plurality of pixel rows shares one A/D conversion circuit 63, and the one A/D conversion circuit 63 is used between the plurality of pixel rows in a time division may be adopted.

Pixel Configuration

Figure 22:
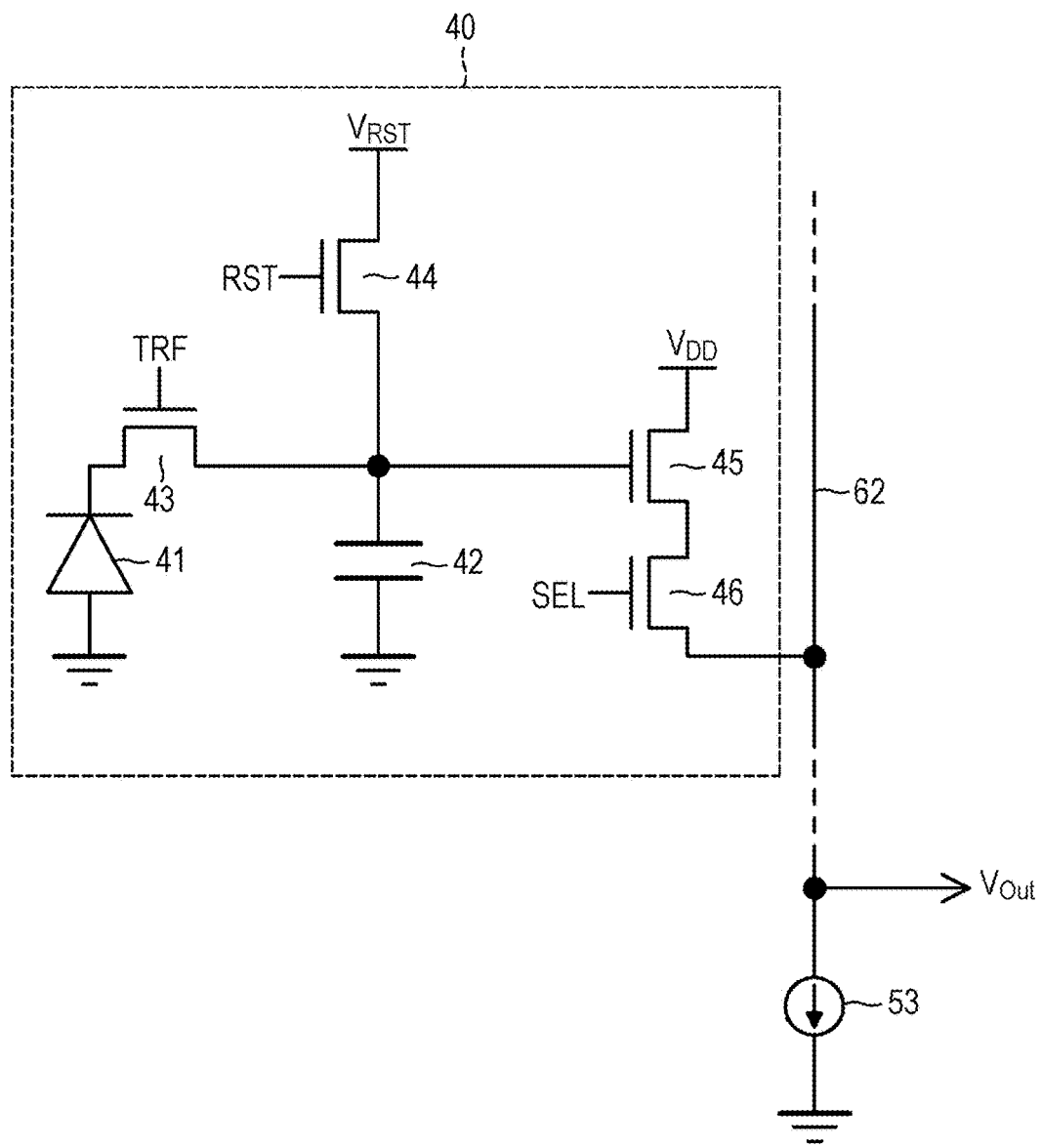
FIG. 22 is a circuit diagram illustrating an example of a pixel configuration of the solid state imaging apparatus.

FIG. 22 illustrates an example of a configuration of the pixel 40. As illustrated in FIG. 12, the pixel 40 according to this configuration example includes, for example, a photodiode 41 as the photoelectric conversion unit. The pixel 40 includes, for example, a charge voltage conversion unit 42, a transmission transistor (a transmission gate portion) 43, a reset transistor 44, an amplification transistor 45, and a selection transistor 46 in addition to the photodiode 41.

Furthermore, here, for example, an N-channel type MOS transistor is used as the transmission transistor 43, the reset transistor 44, the amplification transistor 45, and the selection transistor 46. However, a conductivity type combination of the transmission transistor 43, the reset transistor 44, the amplification transistor 45, and the selection transistor 46 illustrated herein is a mere example, and the conductivity type combination is not limited to the combination.

In the pixel 40, as the column control line 61 ($61_1$ to $61_n$) described above, a plurality of control lines is commonly wired with respect to each pixel in the same pixel column. In FIG. 22, for the sake of simplicity of the drawings, the plurality of control lines is not illustrated. The plurality of control lines is connected to the output end corresponding to each pixel column of the column scanning unit 52 in a pixel column unit. The column scanning unit 52 suitably outputs a transmission signal TRG, a reset signal RST, and a selection signal SEL to the plurality of control lines.

The photodiode 41 of which an anode electrode is connected to a negative side power source (for example, a ground) photoelectrically converts the received light into the optical charge (here, a photoelectron) having a charge amount according to the light amount, and accumulates the optical charge. A cathode electrode of the photodiode 41 is electrically connected to a gate electrode of the amplification transistor 45 through the transmission transistor 43.

A region which is electrically connected to the gate electrode of the amplification transistor 45 is the charge voltage conversion unit 42 for converting the charge into the voltage. Hereinafter, the charge voltage conversion unit 42 is referred to as a floating and diffusion (FD, a floating and diffusion region, an impurity diffusion region) portion 42.

The transmission transistor 43 is connected between the cathode electrode of the photodiode 41 and the FD portion 42. The transmission signal TRG in which a high level (for example, a $V_{DD}$ level) is active (hereinafter, referred to as "High active") is applied to the gate electrode of the transmission transistor 43 from the column scanning unit 13. The transmission transistor 43 is in the conductive state in response to the transmission signal RG, and thus transmits the optical charge which is photoelectrically converted and accumulated by the photodiode 41 to the FD portion 42.

In the reset transistor 44, a drain electrode is connected to a reset power source $V_{RST}$, and a source electrode is connected to the FD portion 42, respectively. The High active reset signal RST is applied to the gate electrode of the reset transistor 44 from the column scanning unit 52. The reset transistor 44 is in the conductive state in response to the reset signal RST, and resets the FD portion 42 by dropping the charge of the FD portion 42 to the reset power source $V_{RST}$.

In the amplification transistor 45, a gate electrode is connected to the FD portion 42, and a drain electrode is connected to a pixel power source $V_{DD}$, respectively. The amplification transistor 45 is an input unit of a source follower which is a reading circuit for reading out the signal obtained by the photoelectric conversion of the photodiode 41. That is, the source electrode of the amplification transistor 45 is connected to a row signal line 22 through the selection transistor 46, and thus configures the source follower with a current source 53 ($53_1$ to $53_m$) connected to one end of the row signal line 22.

In the selection transistor 46, for example, a drain electrode is connected to the source electrode of the amplification transistor 45, and a source electrode is connected to the row signal line 62, respectively. The High active selection signal SEL is applied to the gate electrode of the selection transistor 46 from the column scanning unit 52. The selection transistor 46 is in the conductive state in response to the selection signal SEL, and thus sets the pixel 40 in a selection state and transmits the signal output from the amplification transistor 45 to the row signal line 62.

Furthermore, in the selection transistor 46, a circuit configuration which is connected between the pixel power source $V_{DD}$ and the drain electrode of the amplification transistor 45 may be adopted. In addition, the pixel 40 is not limited to the pixel configuration of four Trs described above, and for example, may be a pixel configuration of three Trs in which the amplification transistor 45 has a function of the selection transistor 46 by omitting the selection transistor 46.

As described above, in the CMOS image sensor of the serial-parallel A/D conversion method, any one of the comparator circuits 10A to 10E according to Example 1 to Example 5 and the comparator circuit 10F according to the modification example may be used as the comparator circuit 71 of the input stage of the A/D conversion circuit 63 ($63_1$ to $63_m$).

In the CMOS image sensor of the serial-parallel A/D conversion method, the following actions and effects are able to be obtained by using the comparator circuits 10A to 10E according to Example 1 to Example 5, or the comparator circuit 10F according to the modification example as the comparator circuit 71 of the A/D conversion circuit 63 ($63_1$ to $63_m$) disposed in each pixel row.

That is, the comparator circuits 10A to 10E according to Example 1 to Example 5, or the comparator circuit 10F according to the modification example are able to reduce the power consumption. Accordingly, in the CMOS image sensor of the serial-parallel A/D conversion method in which the comparator circuit 33 is disposed in each pixel row, it is possible to considerably reduce the power consumption of the entire CMOS image sensor.

In addition, in the comparator circuits 10A to 10E according to Example 1 to Example 5, or the comparator circuit 10F according to the modification example, the control unit 13 for controlling the current is embedded, and thus the wiring for transmitting the control signal at the time of controlling the current by receiving the control signal from the outside is not necessary. Accordingly, in the CMOS image sensor of the serial-parallel A/D conversion method in which the comparator circuit 33 is disposed in each pixel row, the number of wire lines is able to be considerably reduced.

Furthermore, in this Example, any one of comparator circuits 10A to 10E according to Example 1 to Example 5, and the comparator circuit 10F according to the modification example is used as the comparator circuit 71 of the input stage of the A/D conversion circuit 63 in the CMOS image sensor of the serial-parallel A/D conversion method, but the configuration is not limited thereto. That is, any one of comparator circuits 10A to 10E according to Example 1 to Example 5, and the comparator circuit 10F according to the modification example may be used as the comparator circuit of the input stage of a single A/D conversion circuit, or may be used as the comparator circuit of the input stage of the A/D conversion circuit in various electronic circuits using the A/D conversion circuit.

Furthermore, the present disclosure may be configured as follows.

(A1) A comparator circuit, including:
a differential circuit unit which detects a difference between two input signals;
a current supply unit which supplies a current to the differential circuit unit; and
a control unit which detects an operation timing of the differential circuit unit and controls the current supplied to the differential circuit unit by the current supply unit according to a detection result thereof.

(A2) The comparator circuit according to (A1),
in which the current supply unit is able to selectively supply a first current, and a second current which is lower than the first current to the differential circuit unit.

(A3) The comparator circuit according to (A2),
in which the control unit controls the current supply unit to supply the second current when the differential circuit unit is in a standby state, and to switch a supply of the second current to a supply of the first current right before the differential circuit unit is shifted from the standby state to an operating state.

(A4) The comparator circuit according to (A3),
in which the differential circuit unit includes a differential amplifier which outputs a signal according to the difference between the two input signals, and a first amplifier, to which an output signal of the differential amplifier is input, and
the control unit includes a second amplifier having a threshold voltage lower than a threshold voltage of the first amplifier, to which the output signal of the differential amplifier is input, and controls the current supply unit to switch between the first current and the second current according to an output signal of the second amplifier.

(A5) The comparator circuit according to any one of (A2) to (A4),
in which the current supply unit includes a first current source which supplies the first current, a current constraint unit which constrains the first current supplied from the first current source to the second current, and a switch circuit which selectively short-circuits between an input end and an output end of the current constraint unit, and
the control unit controls the switch circuit to be in an OFF state when the differential circuit unit is in the standby state, and to be in an ON state right before the differential circuit unit is shifted from the standby state to an operating state.

(A6) The comparator circuit according to (A5),
in which the first current source includes a first current source transistor having a channel length corresponding to the first current, and
the current constraint unit includes a second current source transistor having a channel length longer than the channel length of the first current source transistor, which is serially connected to the first current source transistor and connected parallel to the switch circuit.

(A7) The comparator circuit according to (A5),
in which the first current source includes a first current source transistor in which a first bias voltage corresponding to the first current is applied to a gate electrode, and the current constraint unit includes a third current source transistor in which a second bias voltage for narrowing the first current supplied from the first current source transistor to the second current is applied to a gate electrode, and which is serially connected to the first current source transistor, and connected parallel to the switch circuit.

(A8) The comparator circuit according to any one of (A2) to (A4),
in which the current supply unit includes a second current source for supplying the second current, and a third current source for supplying a third current which becomes the first current by being added to the second current, and
the control unit controls the third current source to be in an inactive state when the differential circuit unit is in the standby state, and to be in an active state right before the differential circuit unit is shifted from the standby state to an operating state.

(A9) The comparator circuit according to (A8),
in which the second current source includes a fourth current source transistor in which a third bias voltage corresponding to the second current is applied to a gate electrode, and
the third current source includes a fifth current source transistor which is connected parallel to the fourth current source transistor, and outputs the third current at the time of a conductive state.

(A10) The comparator circuit according to (A8) or (A9),
in which the second current source has a function of selectively blocking the supply of the current with respect to the differential circuit unit in a predetermined period during which the differential circuit unit is in the standby state.

(A11) The comparator circuit according to (A10),
in which the differential circuit unit includes a differential amplifier which outputs a signal according to the difference between the two input signals, and
the second current source includes a first switch circuit which is in an OFF state according to a control waveform and blocks the supply of the current with respect to the differential amplifier in the predetermined period during which the differential circuit unit is in the standby state.

(A12) The comparator circuit according to (A11),
in which the second current source includes a second switch circuit which stabilizes an output voltage of the differential circuit unit by performing an ON/OFF operation.

(A13) The comparator circuit according to (A4),
in which the control unit includes a third amplifier having a threshold voltage higher than the threshold voltage of the first amplifier, to which the output signal of the differential amplifier is input, and controls the current supply unit to switch between the first current and the second current according to the output signal of the second amplifier and an output signal of the third amplifier.

(A14) The comparator circuit according to any one of (A1) to (A13),
in which any one of the two input signals is a signal voltage of a projection signal, and
the other one of the two input signals is a control waveform having a voltage change of a saw tooth waveform.

(A15) A comparator circuit control method,
in which in control of a comparator circuit including:
a differential circuit unit which detects a difference between two input signals; and
a current supply unit which supplies a current to the differential circuit unit, an operation timing of the differential circuit unit is detected, and the current supplied to the differential circuit unit by the current supply unit is controlled according to a detection result thereof.

(A16) An A/D conversion circuit which includes a comparator circuit including:

a differential circuit unit which detects a difference between two input signals;

a current supply unit which supplies a current to the differential circuit unit; and a control unit which detects an operation timing of the differential circuit unit and controls the current supplied to the differential circuit unit by the current supply unit according to a detection result thereof.

(A17) A display apparatus in which a plurality of pixels including a light emitting unit, and a driving circuit for driving the light emitting unit, is arranged in the shape of a two-dimensional matrix, in which the driving circuit includes a comparator circuit which compares a signal voltage and a control waveform, and a driving transistor which drives the light emitting unit according to an output of the comparator circuit, and the comparator circuit includes a differential circuit unit which detects a difference between the signal voltage and the control waveform, a current supply unit which supplies a current to the differential circuit unit, and a control unit which detects an operation timing of the differential circuit unit, and controls the current supplied to the differential circuit unit by the current supply unit according to a detection result thereof.

(A18) The display apparatus according to (A17), in which the plurality of pixels is arranged in the shape of the two-dimensional matrix in a first direction and a second direction, and a pixel group is divided into P pixel blocks along the first direction, and the light emitting unit configuring the pixel belonging to a first pixel block to the light emitting unit configuring the pixel belonging to a P-th pixel block in each pixel block sequentially and concurrently emit light, and when the light emitting unit configuring the pixel belonging to a part of the pixel block emits the light, the light emitting unit configuring the pixel belonging to the remaining pixel blocks does not emit the light.

(A19) The display apparatus according to (A17) or (A18), in which the light emitting unit emits the light multiple times on the basis of a plurality of control waveforms.

(A20) The display apparatus according to (A17) or (A18), in which the number of control waveforms supplied to the driving circuit in one display frame is smaller than the number of control waveforms in the one display frame.

It should be understood by those skilled in the art that various modifications, combinations, sub-combinations and alterations may occur depending on design requirements and other factors insofar as they are within the scope of the appended claims or the equivalents thereof.

(B1) A comparator circuit, comprising:

a differential circuit configured to detect a difference between two input signals;

a current supply configured to supply a current to the differential circuit; and a control unit configured to detect an operation timing of the differential circuit and to control the current supplied to the differential circuit by the current supply according to a detection result thereof.

(B2) The comparator circuit according to (B1), wherein the current supply is arranged to selectively supply a first current at a first time and a second current at a second time which is lower than the first current to the differential circuit.

(B3) The comparator circuit according to (B2), wherein the control unit is configured to control the current supply to supply the second current when the differential circuit is in a standby state, and to switch a supply of the second current to a supply of the first current before the differential circuit is shifted from the standby state to an operating state.

(B4) The comparator circuit according to (B3), wherein the differential circuit includes a differential amplifier arranged to output a signal according to the difference between the two input signals, and a first amplifier having a first threshold voltage, to which an output signal of the differential amplifier is input, and the control unit includes a second amplifier having a second threshold voltage lower than the first threshold voltage of the first amplifier, to which the output signal of the differential amplifier is input, wherein an output from the second amplifier is coupled to the current supply to control the current supply to switch between the first current and the second current according to an output signal of the second amplifier.

(B5) The comparator circuit according to (B2), wherein the current supply comprises:

a first source of current configured to supply the first current;

a current limiter configured to constrain the first current supplied from the first source of current to the second current; and a switch circuit arranged to selectively short-circuit between an input end and an output end of the current limiter, and wherein the control unit is configured to control the switch circuit to be in an OFF state when the differential circuit is in the standby state, and to be in an ON state before the differential circuit is shifted from the standby state to an operating state.

(B6) The comparator circuit according to (B5), wherein the first source of current includes a first transistor having a channel length corresponding to the first current, and the current limiter includes a second transistor having a channel length longer than the channel length of the first transistor, and is connected serially to the first transistor and in parallel to the switch circuit.

(B7) The comparator circuit according to (B5), wherein the first source of current includes a first transistor configured to be biased at a first bias voltage at a first gate electrode to provide the first current, and the current limiter includes a third transistor configured to be biased at a second bias voltage at a third gate electrode to constrain the first current supplied from the first transistor and provide the second current, wherein the third transistor is connected serially to the first transistor, and is connected in parallel to the switch circuit.

(B8) The comparator circuit according to (B2), wherein the current supply includes a second source of current for supplying the second current, and a third source of current arranged to provide a third current that is added to the second current to provide the first current, and the control unit is configured to control the third source of current to be in a low state when the differential circuit is in the standby state, and to be in a high state before the differential circuit is shifted from the standby state to an operating state.

(B9) The comparator circuit according to (B8),
wherein the second source of current includes a fourth transistor configured to be biased at a third bias voltage corresponding to the second current, and the third source of current includes a fifth transistor connected in parallel to the fourth transistor, and is configured to output the third current at a time of the high state.

(B10) The comparator circuit according to (B8), wherein the second source of current is configured to selectively reduce the supply of the current with respect to the differential circuit in a predetermined period during which the differential circuit is in the low state.

(B11) The comparator circuit according to (B10),
wherein the differential circuit includes a differential amplifier configured to output a signal according to the difference between the two input signals, and the second source of current includes a first switch circuit configured to be in a first state according to a control waveform to reduce the supply of the current to the differential amplifier in the predetermined period during which the differential circuit is in the low state.

(B12) The comparator circuit according to (B11), wherein the second source of current includes a second switch circuit configured to stabilize an output voltage of the differential circuit by performing an ON/OFF operation.

(B13) The comparator circuit according to (B4), wherein the control unit includes a third amplifier having a threshold voltage higher than the threshold voltage of the first amplifier, to which the output signal of the differential amplifier is input, and wherein the control unit is configured to control the current supply to switch between the first current and the second current according to the output signal of the second amplifier and an output signal of the third amplifier.

(B14) The comparator circuit according to (B1), wherein the comparator circuit is configured to receive a projection signal as a first input signal of the two input signals and a control waveform having a voltage change of a saw tooth waveform as a second input signal of the two input signals.

(B15) A comparator circuit control method comprising:
detecting, with a differential circuit, a difference between two input signals; supplying, with a current supply, a current to the differential circuit;
detecting an operation timing of the differential circuit; and
controlling, with a control unit, the current supplied to the differential circuit by the current supply based on the detected operation timing.

(B16) A display apparatus comprising a plurality of pixels arranged in a two-dimensional matrix, light emitting units, and driving circuits for driving the light emitting units, wherein the driving circuits include:
a comparator circuit configured to compare a signal voltage and a control waveform; and
a driving transistor configured to drive a light emitting unit according to an output of the comparator circuit, wherein the comparator circuit includes:
a differential circuit configured to detect a difference between the signal voltage and the control waveform;
a current supply configured to supply a current to the differential circuit; and
a control unit configured to detect an operation timing of the differential circuit, and to control the current supplied to the differential circuit by the current supply according to a detection result thereof.

(B17) The display apparatus according to (B16),
wherein the plurality of pixels is arranged in the shape of the two-dimensional matrix in a first direction and a second direction, and the plurality of pixels is divided into P pixel blocks along the first direction, and light emitting units corresponding to a first pixel block to a Pth pixel block are configured to sequentially and concurrently emit light, and light emitting units belonging to remaining pixel blocks are configured to not emit light when the light emitting units corresponding to the first pixel block to Pth pixel block emit light.

(B18) The display apparatus according to (B16), wherein the light emitting units are configured to emit the light multiple times on the basis of a plurality of control waveforms.

What is claimed is:

1. A comparator circuit comprising:
a differential circuit configured to receive two input signals;
a current supply circuit configured to supply a first supply current or a second supply current that is greater than the first supply current to operate the differential circuit; and
a control circuit configured to detect an output from the differential circuit and to control the current supply circuit to apply and maintain for a period of time either the first supply current or the second supply current based on a timing of the detected output.

2. The comparator circuit of claim 1, wherein the control circuit is configured to control the current supply circuit to provide the first supply current when the differential circuit is in a standby state, and to switch from the first supply current to the second supply current before the differential circuit shifts from the standby state to an operating state.

3. The comparator circuit of claim 1, wherein the differential circuit includes a differential amplifier arranged to output a signal according to a difference between the two input signals, and a first amplifier having a first threshold voltage, to which an output signal of the differential amplifier is input.

4. The comparator circuit of claim 3, wherein the control circuit includes a second amplifier having a second threshold voltage lower than the first threshold voltage of the first amplifier, to which the output signal of the differential amplifier is input, wherein an output from the second amplifier is coupled to the current supply circuit to control the current supply circuit to switch between the first supply current and the second supply current according to an output signal of the second amplifier.

5. The comparator circuit of claim 4, wherein the control circuit further includes a third amplifier having a threshold voltage higher than the threshold voltage of the first amplifier, to which the output signal of the differential amplifier is input, and wherein the control circuit is configured to control the current supply circuit to switch between the first current and the second current according to the output signal of the second amplifier and an output signal of the third amplifier.

6. The comparator circuit of claim 1, arranged to receive a projection signal as a first input signal of the two input signals and a saw-tooth control waveform as a second input signal of the two input signals.

7. The comparator circuit of claim 1, further comprising:
a display apparatus that includes a plurality of pixels arranged in a two-dimensional matrix;
a light emitting unit associated with one pixel of the plurality of pixels; and
a driving transistor configured to receive an output from the comparator circuit and drive the light emitting unit in response to the received output from the comparator circuit.

8. The comparator circuit of claim 7, wherein the two input signals comprise a projection signal and a control waveform, and wherein the plurality of pixels is arranged in the shape of the two-dimensional matrix in a first direction and a second direction, and the plurality of pixels is divided into P pixel blocks along the first direction, each of the P pixel blocks containing a plurality of light emitting units, and light emitting units corresponding to a first pixel block to a Pth pixel block are configured to sequentially emit light on a pixel block by pixel block basis, wherein light emitting units from two pixel blocks emit light concurrently.

9. The comparator circuit of claim 1, wherein the current supply circuit comprises:
   a first current source configured to supply the second supply current;
   a current limiter configured to constrain the second supply current supplied from the first source of current to the first supply current.

10. The comparator circuit of claim 9, further comprising a switch circuit arranged to selectively short-circuit between an input end and an output end of the current limiter, wherein the control circuit is configured to control the switch circuit to be in an OFF state when the differential circuit is in the standby state, and to be in an ON state before the differential circuit is shifted from the standby state to an operating state.

11. The comparator circuit of claim 9, wherein the first current source includes a first transistor having a channel length corresponding to the second current, and
   the current limiter includes a second transistor having a channel length longer than the channel length of the first transistor, and is connected serially to the first transistor and in parallel to the switch circuit.

12. The comparator circuit of claim 9, wherein the first current source includes a first transistor configured to be biased at a first bias voltage at a first gate electrode to provide the second current, and
   the current limiter includes a second transistor configured to be biased at a second bias voltage at a second gate electrode to constrain the second current supplied from the first transistor and provide the first current, wherein the second transistor is connected serially to the first transistor, and is connected in parallel to the switch circuit.

13. The comparator circuit of claim 1, wherein the current supply includes a first current source arranged to provide the first current, and a second current source arranged to provide a third current that is added to the first current to provide the second current, and
   the control circuit is configured to control the second current source to be in a low state when the differential circuit is in the standby state, and to be in a high state before the differential circuit shifts from the standby state to an operating state.

14. The comparator circuit of claim 13, wherein the first current source includes a first transistor configured to be biased at a first bias voltage corresponding to the first current, and
   the second source of current includes a second transistor connected in parallel to the first transistor, and is configured to output the third current at a time of the high state.

15. The comparator circuit of claim 13, wherein the second current source is configured to selectively reduce the supply of the second current to the differential circuit during a predetermined period in which the differential circuit is in the standby state.

16. The comparator circuit of claim 13, wherein the differential circuit includes a differential amplifier configured to output a signal according to the difference between the two input signals, and
   the second current source includes a first switch circuit configured to be in a first state according to a control waveform to reduce the supply of the second current to the differential amplifier during the predetermined period.

17. The comparator circuit of claim 16, wherein the second current source includes a second switch circuit configured to stabilize an output voltage of the differential circuit by performing an ON/OFF operation.

* * * * *